US010950494B2

(12) United States Patent
Huesken et al.

(10) Patent No.: US 10,950,494 B2
(45) Date of Patent: Mar. 16, 2021

(54) SEMICONDUCTOR DEVICE INCLUDING FIRST AND SECOND CONTACT LAYERS AND MANUFACTURING METHOD

(71) Applicant: Infineon Technologies AG, Neubiberg (DE)

(72) Inventors: Holger Huesken, Munich (DE); Frank Dieter Pfirsch, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/251,729

(22) Filed: Jan. 18, 2019

(65) Prior Publication Data

US 2019/0229013 A1 Jul. 25, 2019

(30) Foreign Application Priority Data

Jan. 19, 2018 (DE) ........................ 10 2018 101 174

(51) Int. Cl.
*H01L 21/768* (2006.01)
*H01L 23/532* (2006.01)

(52) U.S. Cl.
CPC .. *H01L 21/76831* (2013.01); *H01L 21/76802* (2013.01); *H01L 21/76834* (2013.01); *H01L 23/53204* (2013.01)

(58) Field of Classification Search
None
See application file for complete search history.

(56) References Cited

U.S. PATENT DOCUMENTS 8,183,103 B2 5/2012 Liu
8,610,275 B2 12/2013 Zhu et al.
8,877,614 B2 11/2014 Ko et al.
2005/0029584 A1* 2/2005 Shiraishi ........... H01L 29/66727 257/329
2009/0189218 A1* 7/2009 Pan .................. H01L 29/66727 257/330
2011/0204485 A1* 8/2011 Momota ........... H01L 29/66348 257/621
(Continued)

FOREIGN PATENT DOCUMENTS

DE 102006045126 A1 4/2007

*Primary Examiner* — Zandra V Smith
*Assistant Examiner* — Lawrence C Tynes, Jr.
(74) *Attorney, Agent, or Firm* — Murphy, Bilak & Homiller, PLLC

(57) ABSTRACT

An embodiment relates to a method for manufacturing a semiconductor device. The method includes providing a semiconductor body including a first semiconductor region of a first conductivity type and a second semiconductor region of a second conductivity type interposed between the first semiconductor region and a first surface of the semiconductor body. The method further includes forming a first contact layer over the first surface of the semiconductor body. The first contact layer forms a direct electrical contact to the second semiconductor region. The method further includes forming a contact trench extending into the semiconductor body by removing at least a portion of the second semiconductor region. The method further includes forming a second contact layer in the contact trench. The second contact layer is directly electrically connected to the semiconductor body at a bottom side of the contact trench.

15 Claims, 32 Drawing Sheets

(56) References Cited

U.S. PATENT DOCUMENTS

| | | | | | |
|---|---|---|---|---|---|
| 2012/0025874 | A1* | 2/2012 | Saikaku | H01L 29/7397 | 327/109 |
| 2012/0037922 | A1* | 2/2012 | Kono | H01L 29/7802 | 257/77 |
| 2013/0207252 | A1* | 8/2013 | Muto | H01L 23/49548 | 257/676 |

* cited by examiner

SEMICONDUCTOR DEVICE INCLUDING FIRST AND SECOND CONTACT LAYERS AND MANUFACTURING METHOD

TECHNICAL FIELD

The present disclosure relates to manufacturing methods and semiconductor devices including first and second contact layers for providing an electrical contact to different semiconductor regions.

BACKGROUND

In semiconductor devices, for example insulated gate field effect transistors (power IGFETs) or insulated gate bipolar transistors (IGBTs), low on-state voltage and high robustness against avalanche and over-current turn-off are desired. Electrical contacts to semiconductor regions have an impact on above characteristics. It is desirable to improve an electrical contact to semiconductor regions.

SUMMARY

The present disclosure relates to a method for manufacturing a semiconductor device. The method comprises providing a semiconductor body comprising a first semiconductor region of a first conductivity type and a second semiconductor region of a second conductivity type interposed between the first semiconductor region and a first surface of the semiconductor body. The method further comprises forming a first contact layer over the first surface of the semiconductor body. The first contact layer forms a direct electrical contact to the second semiconductor region. The method further comprises forming a contact trench extending into the semiconductor body by removing at least a portion of the second semiconductor region. The method further comprises forming a second contact layer in the contact trench, wherein the second contact layer is directly electrically connected to the semiconductor body at a bottom side of the contact trench. The method allows for an improved electrical connection to semiconductor regions of n- and p-conductivity type, for example to source and body regions via a contact structure or a trench contact that may be manufactured by a single photolithography process and may include, for example self-aligned process features.

In some embodiments, the process of forming the contact trench is carried out before forming the first contact layer, the first contact layer covering the first surface and lining sidewalls and a bottom side of the contact trench. The first contact layer may be formed by a conformal deposition technique, for example by sputtering, by chemical vapor deposition (CVD) or by physical layer deposition (PLD). Some embodiments further comprise removing the first contact layer at least from the bottom side of the contact trench while leaving a contact spacer at the sidewalls of the contact trench. The contact spacer is a remnant of the first contact layer at the sidewalls of the contact trench that is electrically connected to the second semiconductor region. This may allow for a beneficial direct electrical connection of the second semiconductor region, for example a source region via a side surface of the second semiconductor region. In some embodiments, a highly doped contact layer may be formed at the bottom side of the contact trench, for example by introducing dopants into the semiconductor body through the bottom side of the contact trench. The dopants may be introduced by diffusion and/or ion implantation, for example. The highly doped contact layer may allow for an improved ohmic contact to the first semiconductor region. The highly doped contact layer may be of the conductivity type of the first semiconductor region, for example.

Some embodiments comprise forming a contact opening in an interlayer dielectric on the semiconductor body before forming the first contact layer, the contact opening exposing a surface portion of the second semiconductor region. The first contact layer lines sidewalls and a bottom side of the contact opening and is electrically connected to the second semiconductor region at the surface portion. Thus, the contact opening extends up to or slightly into the second semiconductor region for exposing the surface portion that serves as the electrical contact area for the first contact layer. The contact opening may be formed by a photolithography process, for example by photolithographic patterning of an etch mask. In some embodiments the contact trench extends through the first contact layer from a bottom side of the contact opening. The contact trench may be formed self-aligned with respect to the contact opening. Self-aligned formation of the contact trench does not require a separate photolithography process in addition to the photolithography process for forming the contact opening, for example. The embodiment allows for an improved electrical connection to semiconductor regions of n- and p-conductivity type, for example source and body regions via a contact structure that may be manufactured by a single photolithography process and includes self-aligned formation of the contact trench with respect to the contact opening.

The present disclosure further relates to another method for manufacturing a semiconductor device. The method comprises forming a contact trench extending into a semiconductor body from a first surface of the semiconductor body, the semiconductor body comprising a first semiconductor region of a first conductivity type and a second semiconductor region of a second conductivity type interposed between the first semiconductor region and the first surface. The method further comprises forming, thereafter, a first contact layer covering the first surface and lining sidewalls and a bottom side of the contact trench. The method further comprises removing the first contact layer at least from the bottom side of the contact trench while leaving a contact spacer at the sidewalls of the contact trench, the contact spacer being a remnant of the first contact layer at the sidewalls of the contact trench that is directly electrically connected to the second semiconductor region. The method further comprises forming, thereafter, a second contact layer in the contact trench, wherein the second contact layer is electrically connected to the first semiconductor region at a bottom side of the contact trench. The embodiment allows for an improved electrical connection to semiconductor regions of n- and p-conductivity type, for example source and body regions via a contact structure that may be manufactured by a single photolithography process and may include a beneficial electrical connection of the second semiconductor region, for example a source region via a side surface of the second semiconductor region.

The present disclosure further relates to another method for manufacturing a semiconductor device. The method comprises forming a contact opening in an interlayer dielectric on a first surface of a semiconductor body, wherein the semiconductor body comprises a first semiconductor region of a first conductivity type and a second semiconductor region of a second conductivity type interposed between the first semiconductor region and the interlayer dielectric, and wherein a surface portion of the second semiconductor region is exposed by the contact opening. The method further comprises forming a first contact layer over the first surface. The first contact layer lines sidewalls and a bottom side of the contact opening and is directly electrically connected to the second semiconductor region at the surface portion. The method further comprises forming a contact trench extending through the first contact layer at a bottom side of the contact opening and extending into the semiconductor body. The method further comprises forming a second contact layer in the contact trench, wherein the second contact layer is electrically connected to the first semiconductor region at a bottom side of the contact trench. The embodiment allows for an improved electrical connection to semiconductor regions of n- and p-conductivity type, for example source and body regions via a contact structure that may be manufactured by a single photolithography process and may include self-aligned formation of the contact trench with respect to a contact opening that is formed by a photolithography process. While the second semiconductor region is electrically connected by the first contact layer at a bottom side of the contact opening, the first semiconductor region is electrically connected by the second contact layer at a bottom side of the contact trench. The contact trench may extend through the first contact layer, for example.

In some embodiments, a width of the contact opening at a bottom side of the contact opening is greater than a width of the contact trench at the bottom side of the contact opening. This may be achieved by a self-aligned spacer etch process for defining the width of the contact trench at the bottom side of the contact opening, or by using an additional mask layer, for example.

In some embodiments, the second semiconductor region is a source region of an insulated gate field effect transistor, IGFET, or an insulated gate bipolar transistor, IGBT, or a MOS controlled thyristor, MCT. The second semiconductor region may be formed by introducing dopants into the semiconductor body by an ion implantation and/or diffusion process, for example before formation of the contact opening.

In some embodiments, the first conductivity type is p-type, and the first contact layer comprises a first contact material, the first contact material being one or a combination of Ti, W, TiW, Ta, V, Ag, Zr, TiSi, CoSi, and the second contact layer comprises a second contact material, the second contact material being one or a combination of Al, AlSi, AlSiCu, Pt, PtSi, Pd, Ni, Co, Rh. In some other embodiments, the first conductivity type is n-type, and the first contact layer comprises a first contact material, the first contact material being one or a combination of Al, AlSi, AlSiCu, Pt, PtSi, Pd, Ni, Co, Rh, and the second contact layer comprises a second contact material, the second contact material being one or a combination of Ti, W, TiW, Ta, V, Ag, Zr, TiSi, CoSi. These embodiments allow for a beneficial electrical contact to n- and p-doped silicon semiconductor materials, for example.

In some embodiments, a thickness of the first contact layer is at most one-third of a width of the contact trench at a bottom side of the contact trench. This allows for patterning of the first contact layer by a spacer etch process. The contact spacer is a remnant of the first contact layer at the sidewalls of the contact trench and is electrically connected to the second semiconductor region. This may allow for a beneficial electrical connection of the second semiconductor region, for example a source region via a side surface of the second semiconductor region. A space between opposite contact spacers in the contact trench may later be filled with the second contact layer for providing an electrical contact to the first semiconductor region via a bottom side of the contact trench. Thereby, materials of the first and second contact layers may be different from one another. These materials may be selected in view of a favorable electrical connection to the semiconductor regions that are to be electrically connected, for example.

In some embodiments, dopants of the first conductivity type are introduced into or at least adjacent to the first semiconductor region through a bottom side of the contact trench. These dopants may form a highly doped contact layer at the bottom side of the contact trench. The dopants may be introduced by diffusion and/or ion implantation, for example. The highly doped contact layer may allow for an improved ohmic or low-resistive contact to the first semiconductor region. The highly doped contact layer may be of the conductivity type of the first semiconductor region, for example.

In some embodiments, the contact trench is formed by an etch process, and the etch process is terminated before reaching the first semiconductor region. The dopants introduced through a bottom side of the contact trench may be implanted or diffused to an extent that allows for an overlap between the highly doped contact layer defined by these dopants and the first semiconductor region. This may be achieved by appropriately adjusting one or more of an ion implantation energy, an annealing or diffusion temperature and an annealing or diffusion duration, for example.

In some embodiments, the contact trench is formed by an etch process, and the etch process is terminated after etching through the second semiconductor region and into the first semiconductor region. The dopants introduced through a bottom side of the contact trench may be directly implanted or diffused into the first semiconductor region.

In some embodiments, the first semiconductor region has a higher maximum doping concentration than a body region of the first conductivity type surrounding the first semiconductor region. The first semiconductor region may allow for reducing latch-up that may be caused by a parasitic base current of a parasitic bipolar transistor flowing through the body region to an electric contact of the source and body region. The parasitic bipolar transistor is defined by the source region as an emitter and the body region as a base and triggering of the parasitic bipolar transistor may be hindered by the first semiconductor region providing a low resistive current path for the base current.

In some embodiments, the first semiconductor region is a body region. By a single electric contact structure, for example a trench contact including the first and second contact layers, a contact resistance to both the source and body region may be reduced by selecting a material of the first contact layer with respect to a beneficial electrical contact to the source region any by selecting a material of the second contact layer with respect to a beneficial electrical contact to the body region, for example.

The present disclosure further relates to a semiconductor device. The semiconductor device comprises a semiconductor body and an interlayer dielectric on the semiconductor body. The semiconductor body comprises a first semiconductor region of a first conductivity type and a second semiconductor region of a second conductivity type interposed between the first semiconductor region and the interlayer dielectric. The semiconductor device further comprises a trench contact extending through the interlayer dielectric and into the semiconductor body. The trench contact comprises a first contact layer in direct electrical contact to the second semiconductor region, and a second contact layer in direct electrical contact to the first semiconductor region at a bottom side of the contact trench. Materials of the first and second contact layers may be different from one another. These materials may be selected in view of a favorable electrical connection to the semiconductor regions that are to be electrically connected, for example. Thereby, a beneficial electrical connection to semiconductor regions of opposite conductivity type may be achieved by a single contact structure.

In some embodiments, the first contact layer is a contact spacer at a side surface of the trench contact, and the second semiconductor region is directly electrically connected to the trench contact via the contact spacer of the trench contact. A space between opposite contact spacers may be filled by the second contact layer that is electrically connected to the first semiconductor region, for example.

In some embodiments, the first contact layer is directly electrically connected to the second semiconductor region via a top surface portion of the second semiconductor region. By way of example, the trench contact may include an upper contact part having a greater width than a lower contact part. A bottom side of the upper contact part may be in contact with the top surface portion of the second semiconductor region and a bottom side of the lower contact part may be in contact with the first semiconductor region, for example.

In some embodiments, the second semiconductor region is a source region of an insulated gate field effect transistor, IGFET, or an insulated gate bipolar transistor, IGBT, or a MOS controlled thyristor, MCT.

The present disclosure further relates to another method for manufacturing a semiconductor device. The method includes providing a semiconductor body comprising a first semiconductor region of a first conductivity type and second semiconductor regions of a second conductivity type, wherein the second semiconductor regions are separated from each other and interposed between the first semiconductor region and a first surface of the semiconductor body in first parts of the first semiconductor region, wherein the first parts of the first semiconductor region and second parts of the first semiconductor region are alternately arranged along a longitudinal direction of the first semiconductor region. The method further includes forming a first contact layer in direct electrical contact to the second semiconductor regions in the first parts, and forming a second contact layer in direct electrical contact to the first semiconductor region in the second parts.

In some embodiments, the first semiconductor region is a body region of an insulated gate field effect transistor, IGFET, or an insulated gate bipolar transistor, IGBT, or a MOS controlled thyristor, MCT, and the second semiconductor regions are source regions of the insulated gate field effect transistor, IGFET, or the insulated gate bipolar transistor, IGBT, or the MOS controlled thyristor, MCT. A body contact region may be formed between the body region and the second contact layer for improving ohmic contact properties, i.e. for reducing a contact resistance between the body region as an example for the first semiconductor region and the second contact layer.

In some embodiments, a first dimension of the first semiconductor region along a lateral direction perpendicular to the longitudinal direction is larger than a second dimension of the second semiconductor regions along the lateral direction.

In some embodiments, forming the first contact layer is carried out before forming the second contact layer, and the first contact layer is at least partly removed in the second parts.

In some embodiments, the method further includes partly removing the first contact layer in the first parts.

In some embodiments, forming the second contact layer is carried out before forming the first contact layer, and the second contact layer is at least partly removed in the first parts.

In some embodiments, the method further includes forming a contact trench in at least one of the first and second parts, and wherein at least one of the first and second contact layers is formed in the contact trench.

In some embodiments, the second contact layer is partly formed in direct contact with the first contact layer.

In some embodiments, the first conductivity type is p-type, and the first contact layer comprises a first contact material, the first contact material being one or a combination of Ti, W, TiW, Ta, V, Ag, Zr, TiSi, CoSi, and the second contact layer comprises a second contact material, the second contact material being one or a combination of Al, AlSi, AlSiCu, Pt, PtSi, Pd, Ni, Co, Rh, or the first conductivity type is n-type, and the first contact layer comprises a first contact material, the first contact material being one or a combination of Al, AlSi, AlSiCu, Pt, PtSi, Pd, Ni, Co, Rh, and the second contact layer comprises a second contact material, the second contact material being one or a combination of Ti, W, TiW, Ta, V, Ag, Zr, TiSi, CoSi.

The present disclosure further relates to another semiconductor device. The semiconductor device includes a semiconductor body comprising a first semiconductor region of a first conductivity type and second semiconductor regions of a second conductivity type, wherein the second semiconductor regions are separated from each other and interposed between the first semiconductor region and a first surface of the semiconductor body in first parts of the first semiconductor region, wherein the first parts of the first semiconductor region and second parts of the first semiconductor region are alternately arranged along a longitudinal direction of the first semiconductor region. The semiconductor device further includes a first contact layer in direct electrical contact to the second semiconductor regions in the first parts, and a second contact layer in direct electrical contact to the first semiconductor region in the second parts.

In some embodiments, the first semiconductor region is a body region of an insulated gate field effect transistor, IGFET, or an insulated gate bipolar transistor, IGBT, or a MOS controlled thyristor, MCT, and the second semiconductor regions are source regions of the insulated gate field effect transistor, IGFET, or the insulated gate bipolar transistor, IGBT, or the MOS controlled thyristor, MCT. A body contact region may be formed between the body region and the second contact layer for improving ohmic contact properties, i.e. for reducing a contact resistance between the body region as an example for the first semiconductor region and the second contact layer.

In some embodiments, a first dimension of the first semiconductor region along a lateral direction perpendicular to the longitudinal direction is larger than a second dimension of the second semiconductor regions along the lateral direction.

In some embodiments, the semiconductor device further includes a contact trench in at least one of the first and second parts, and wherein at least one of the first and second contact layers is arranged in the contact trench.

In some embodiments, the second contact layer is partly formed in direct contact with the first contact layer.

In some embodiments, the first conductivity type is p-type, and the first contact layer comprises a first contact material, the first contact material being one or a combination of Ti, W, TiW, Ta, V, Ag, Zr, TiSi, CoSi, and the second contact layer comprises a second contact material, the second contact material being one or a combination of Al, AlSi, AlSiCu, Pt, PtSi, Pd, Ni, Co, Rh, or the first conductivity type is n-type, and the first contact layer comprises a first contact material, the first contact material being one or a combination of Al, AlSi, AlSiCu, Pt, PtSi, Pd, Ni, Co, Rh, and the second contact layer comprises a second contact material, the second contact material being one or a combination of Ti, W, TiW, Ta, V, Ag, Zr, TiSi, CoSi.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate the embodiments of the present disclosure and together with the description serve to explain principles of the embodiments. Other embodiments and intended advantages will be readily appreciated as they become better understood by reference to the following detailed description.

DETAILED DESCRIPTION

Figure 1:
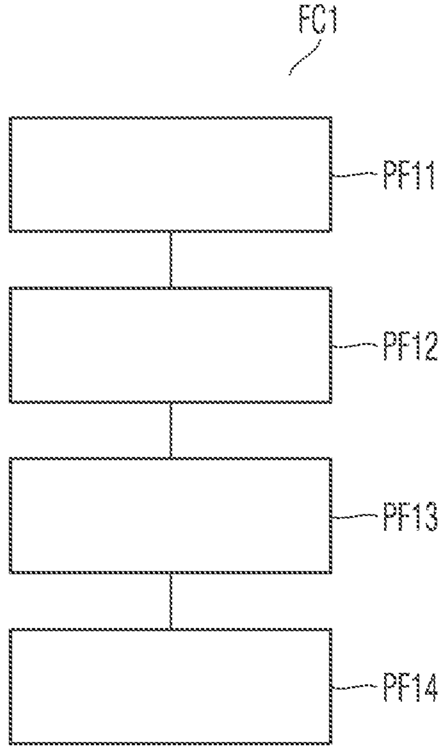
FIG. 1 is a flowchart for visualizing a method for manufacturing a semiconductor device including formation of first and second contact layers.

In the following detailed description, reference is made to the accompanying drawings, which form a part hereof and in which are shown by way of illustrations specific embodiments in which the embodiments may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The direct contact between the concerned elements corresponds to a direct electrical contact/direct electrical connection. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above", "below", "on", and "over" as used in this specification therefore describe a relative location of a structural feature to another. The structural features may be in contact with each other or may be in proximity to each other.

In this specification, p-doped is referred to as first conductivity type while n-doped is referred to as second conductivity type. Alternatively, the semiconductor devices can be formed with opposite doping relations so that the first conductivity type can be n-doped and the second conductivity type can be p-doped.

Figure 2:
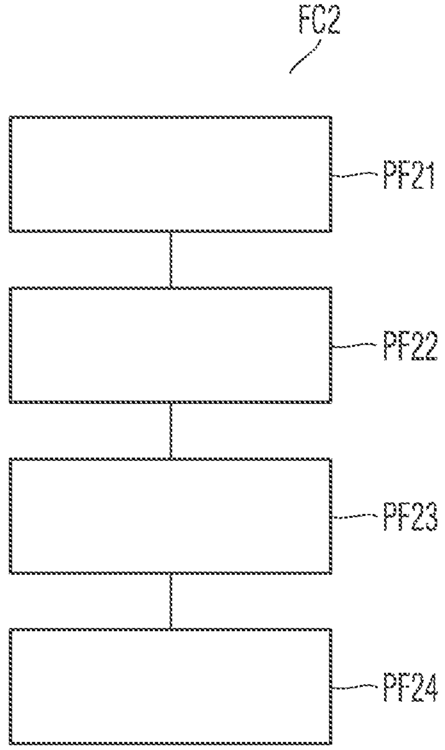
FIG. 2 is a flowchart for visualizing a method for manufacturing a semiconductor device including formation of first and second contact layers, wherein the first contact layer is patterned into contact spacers.
Figure 3:
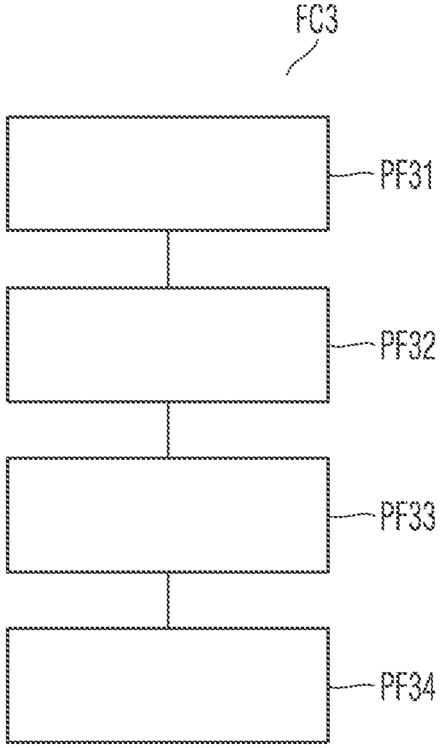
FIG. 3 is a flowchart for visualizing a method for manufacturing a semiconductor device including formation of first and second contact layers, wherein the first contact layer is formed on an exposed top surface portion of a semiconductor region.

FIGS. 1 to 3 are schematic flowcharts FC1, FC2, FC3 for illustrating methods of manufacturing a semiconductor device.

It will be appreciated that while the methods illustrated by the flowcharts FC1, FC2, FC3 are illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Referring to the flowchart FC1 illustrated in FIG. 1, process feature PF11 comprises providing a semiconductor body comprising a first semiconductor region of a first conductivity type and a second semiconductor region of a second conductivity type interposed between the first semiconductor region and a first surface of the semiconductor body.

Process feature PF12 comprises forming a first contact layer over the first surface of a semiconductor body, wherein the first contact layer forms a direct electrical contact to the second semiconductor region.

Process feature PF13 comprises forming a contact trench extending into the semiconductor body by removing at least a portion of the second semiconductor region.

Process feature PF14 comprises forming a second contact layer in the contact trench, wherein the second contact layer is directly electrically connected to the semiconductor body at a bottom side of the contact trench.

In some embodiments, the contact trench is formed after formation of the first contact layer, i.e. process feature PF13 is carried out after process feature PF12. In some other embodiments, the contact trench is formed before formation of the first contact layer, i.e. process feature PF13 is carried out before process feature PF12.

Referring to the flowchart FC2 illustrated in FIG. 2, process feature PF21 comprises forming a contact trench extending into a semiconductor body from a first surface of the semiconductor body, the semiconductor body comprising a first semiconductor region of a first conductivity type and a second semiconductor region of a second conductivity type interposed between the first semiconductor region and the first surface.

Process features PF22 and PF23 are carried out after process feature PF21.

Process feature PF22 comprises forming a first contact layer covering the first surface and lining sidewalls and a bottom side of the contact trench.

Process feature PF23 comprises removing the first contact layer at least from the bottom side of the contact trench while leaving a contact spacer at the sidewalls of the contact trench, the contact spacer being a remnant of the first contact layer at the sidewalls of the contact trench that is directly electrically connected to the second semiconductor region.

Process feature PF24 is carried out after process features PF21, PF22, PF23.

Process feature PF24 comprises forming a second contact layer in the contact trench, wherein the second contact layer is electrically connected to the first semiconductor region at a bottom side of the contact trench.

Referring to the flowchart FC3 illustrated in FIG. 3, process feature PF31 forming a contact opening in an interlayer dielectric on a semiconductor body, wherein the semiconductor body comprises a first semiconductor region of a first conductivity type and a second semiconductor region of a second conductivity type interposed between the first semiconductor region and the interlayer dielectric, and wherein a surface portion of the second semiconductor region is exposed by the contact opening.

Process feature PF32 comprises forming a first contact layer over the first surface and lining sidewalls and a bottom side of the contact opening, wherein the first contact layer is directly electrically connected to the second semiconductor region at the surface portion.

Process feature PF33 comprises forming a contact trench extending through the first contact layer at a bottom side of the contact opening and extending into the semiconductor body.

Process feature PF34 comprises forming a second contact layer in the contact trench, wherein the second contact layer is electrically connected to the first semiconductor region at a bottom side of the contact trench.

FIGS. 4A to 4H illustrate schematic cross-sectional views of a semiconductor body 100 for illustrating a method of manufacturing a semiconductor device. The semiconductor body 100 may be a semiconductor wafer or a semiconductor die or chip sliced from a semiconductor wafer. The semiconductor body 100 may include a semiconductor substrate having none, one or more optional epitaxial layers thereon. The semiconductor body may also include one or more doped semiconductor regions formed therein. The semiconductor body 100 may be a silicon semiconductor body, for example a Czochralski (CZ) silicon semiconductor body such as a magnetic Czochralski (MCZ) silicon semiconductor body, or a Float-Zone (FZ) silicon semiconductor body, for example. In some embodiments, a material of the semiconductor body is another single-crystalline semiconductor material such as silicon carbide (SiC), gallium arsenide (GaAs), gallium nitride (GaN) or another $A_{III}B_{V}$ semiconductor, germanium (Ge) or a silicon germanium (SiGe).

Figure 4A:
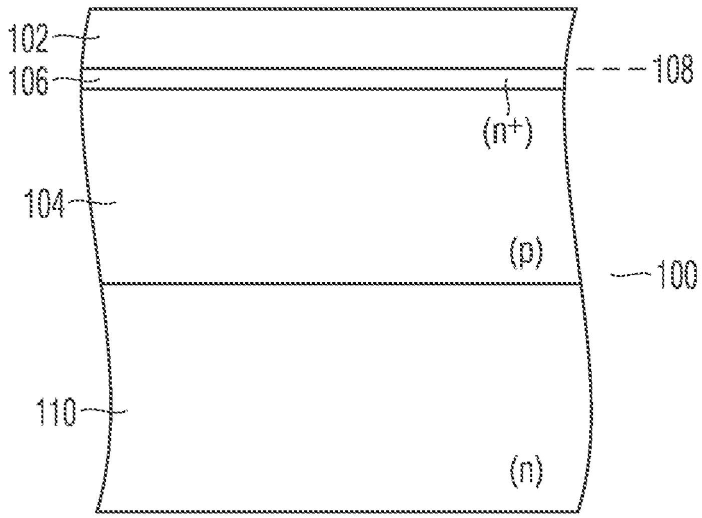
FIG. 4A is a schematic cross-sectional view of a semiconductor body for illustrating a method of manufacturing a semiconductor device.

Referring to the schematic cross-sectional view of FIG. 4A, an interlayer dielectric 102 is formed on a semiconductor body 100 comprising a p-type first semiconductor region 104 and an n+-type second semiconductor region 106 interposed between the first semiconductor region 104 and a first surface 108. The p-type first semiconductor region 104 and the n+-type second semiconductor region 106 may be formed by introducing dopants into a semiconductor substrate 110, for example by ion implantation and/or diffusion of dopants. The interlayer dielectric 102 may include one or a stack of dielectric materials, for example oxide(s), nitride (s), high-k dielectric(s), low-k dielectric(s). The interlayer dielectric may be formed by any suitable layer formation technique including chemical vapor deposition (CVD) and thermal oxidation.

Figure 4B:
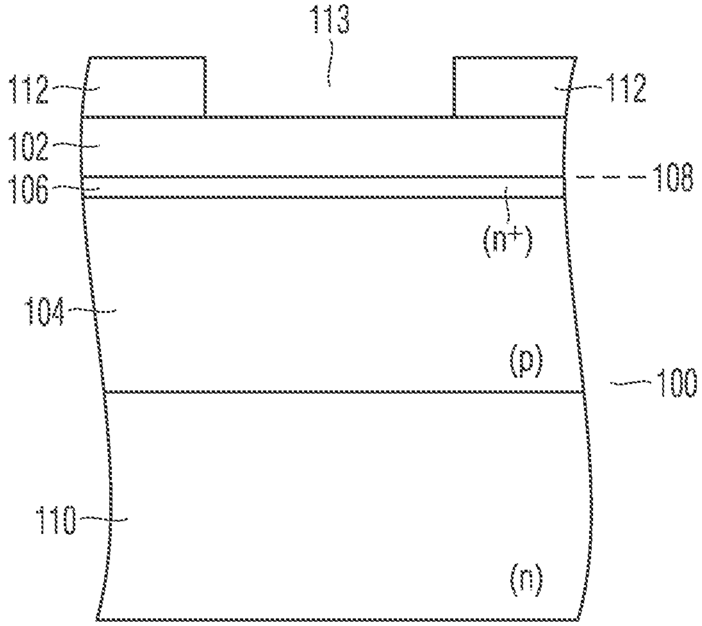
FIG. 4B is a schematic cross-sectional view of the semiconductor body of FIG. 4A after patterning a mask layer.

Referring to the schematic cross-sectional view of FIG. 4B, a mask layer 112 is formed on the interlayer dielectric 102. The mask layer may be a hard mask layer, for example a dielectric layer that can be selectively patterned with respect to a material of the interlayer dielectric 102. In this case, an opening 113 in the hard mask layer may be formed by photolithography using a resist mask pattern above the hard mask layer (not illustrated in FIG. 4B). The mask layer 112 may also be a resist mask layer that is patterned by photolithography for providing the opening 113.

Figure 4C:
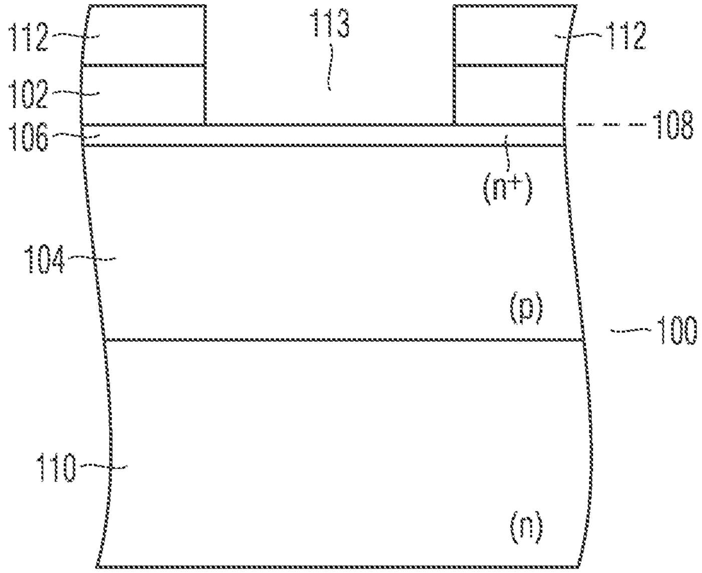
FIG. 4C is a schematic cross-sectional view of the semiconductor body of FIG. 4B after etching an opening into an interlayer dielectric.

Referring to the schematic cross-sectional view of FIG. 4C, the opening 113 is enlarged toward the first surface 108 by extending the opening through the interlayer dielectric 102, for example by an etch process. The opening 113 may be formed in the course of providing the patterned mask layer 112, i.e. by a single etch process that removes material of both the mask layer 112 and the interlayer dielectric 102, for example. In some other embodiments, the opening 113 in the mask layer 112 and in the interlayer dielectric 102 may be formed by separate etch processes carried out one after another, for example.

Figure 4D:
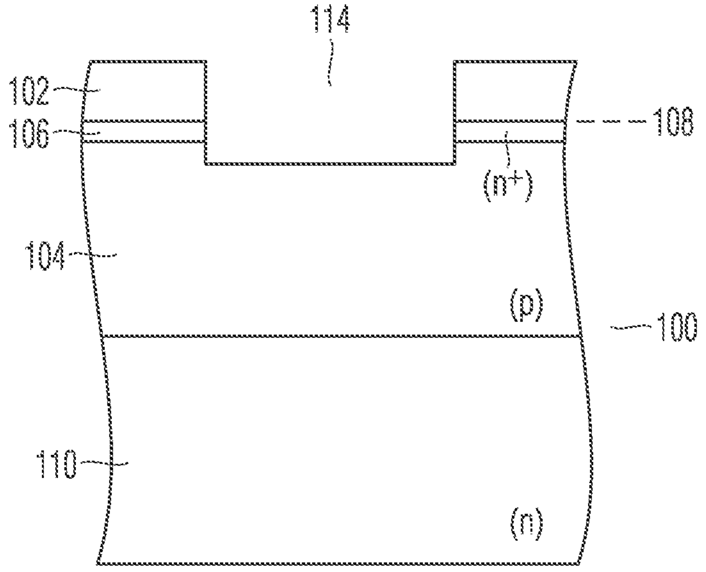
FIG. 4D is a schematic cross-sectional view of the semiconductor body of FIG. 4C after further etching the opening into the semiconductor body, thereby forming a contact trench.

Referring to the schematic cross-sectional view of FIG. 4D, the opening 113 is further enlarged into the semiconductor body 100, thereby forming a contact trench 114 into the semiconductor body 100 that extends through the second semiconductor region 106. The contact trench 114 may be enlarged into the semiconductor body 100 by continuing with the etch process that removed material of the interlayer dielectric 102, for example. In some other embodiments, different etch processes may be used for removing material of the interlayer dielectric 102 and for removing material of the semiconductor body 100, for example. The mask layer 112 may be removed by any suitable process.

Figure 4E:
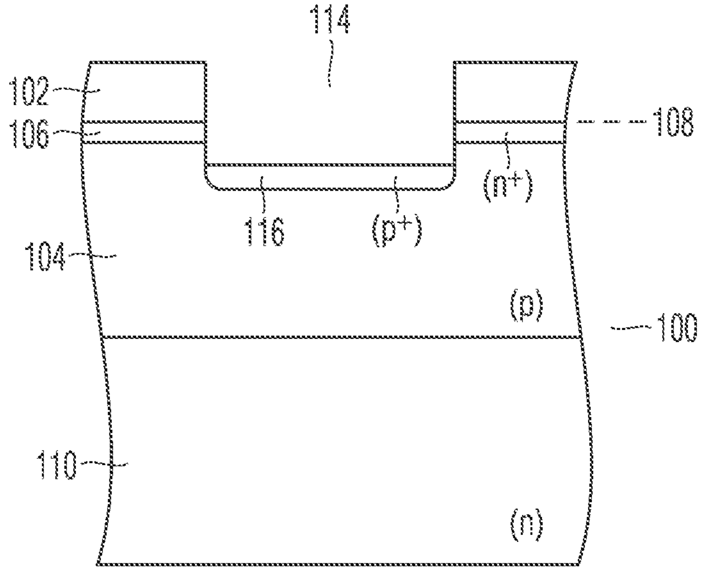
FIG. 4E is a schematic cross-sectional view of the semiconductor body of FIG. 4D after forming an optional contact region at a bottom of the contact trench.

Referring to the schematic cross-sectional view of FIG. 4E, an optional $p^+$-type contact region 116 is formed in the semiconductor body 100 at a bottom of the contact trench 114. The $p^+$-type contact region 116 may be formed by introducing p-type dopants into the semiconductor body 100 through the bottom of the contact trench, for example by ion implantation and/or diffusion. The $p^+$-type contact region 116 is optional since it may be dispensed with in case a doping concentration of the p-type first semiconductor region 104 is large enough at the bottom of the contact trench 114 for forming an ohmic electrical contact thereon by a suitable contact material, for example.

Figure 4F:
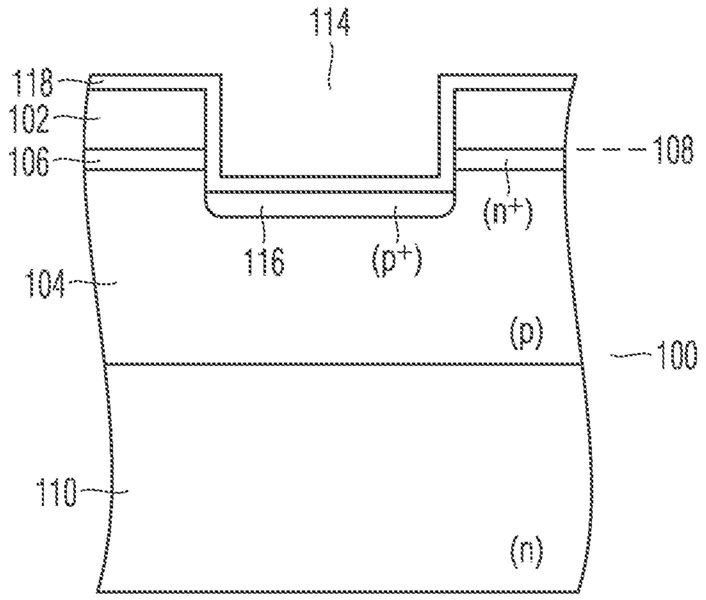
FIG. 4F is a schematic cross-sectional view of the semiconductor body of FIG. 4E after forming a first contact layer lining sidewalls and a bottom of the contact trench.

Referring to the schematic cross-sectional view of FIG. 4F, a first contact layer 118 is formed on the interlayer dielectric 102, at sidewalls of the contact trench 114 and on a bottom of the contact trench 114. The first contact layer 118 may be formed by a layer deposition process, for example by chemical vapor deposition (CVD), by sputtering, or by physical vapor deposition (PVD), for example. The first contact layer 118 may be formed by a single material or by a stack of different materials, for example. A material of the first contact layer 118 may be selected with respect to a desired electrical contact to the second semiconductor region 106. In embodiments where the second semiconductor region 106 is made of n-type silicon, the first contact layer 118 may include one or a combination of Ti, W, TiW, Ta, V, Ag, Zr, TiSi, CoSi, for example. In embodiments where the second semiconductor region 106 is made of p-type silicon, the first contact layer 118 may include one or a combination of Al, AlSi, AlSiCu, Pt, PtSi, Pd, Ni, Co, Rh, for example.

Figure 4G:
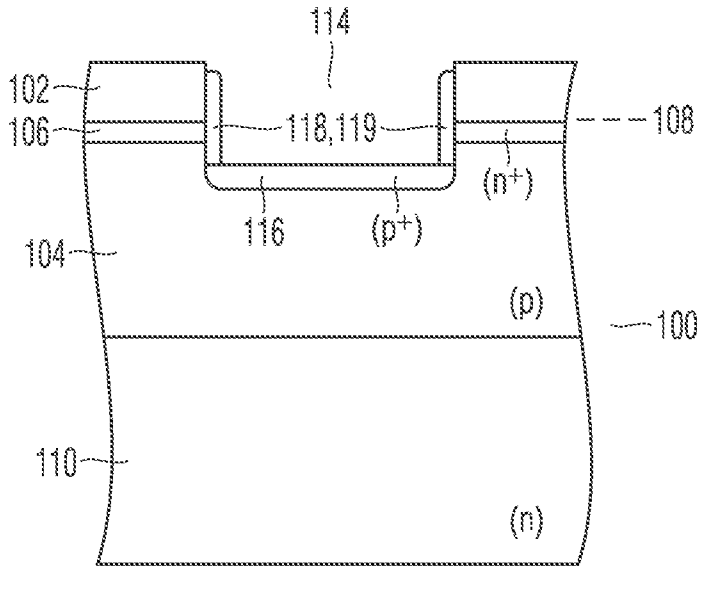
FIG. 4G is a schematic cross-sectional view of the semiconductor body of FIG. 4F after forming contact spacers out of the first contact layer.

Referring to the schematic cross-sectional view of FIG. 4G, the first contact layer 118 is removed from a surface of the interlayer dielectric 102 and from a bottom of the contact trench 114, for example by an anisotropic etch process. Contact spacers 119 remain as the first contact layer 118 providing a direct electrical contact to the second semiconductor region 106 via a side surface of the second semiconductor region 106.

Figure 4H:
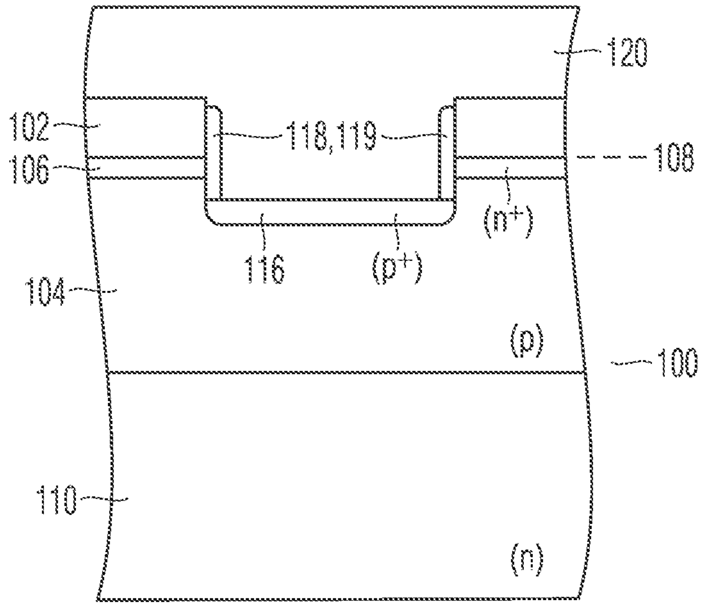
FIG. 4H is a schematic cross-sectional view of the semiconductor body of FIG. 4F after forming a second contact layer in the contact trench.

Referring to the schematic cross-sectional view of FIG. 4H, a second contact layer 120 is formed in the contact trench 114, for example by a layer deposition process such as chemical vapor deposition (CVD), by sputtering, or physical vapor deposition (PVD), thereby filling a space between the contact spacers 119. The second contact layer 120 may be formed by a single material or by a stack of different materials, for example. A material of the second contact layer 120 may be selected with respect to a desired electrical contact to the first semiconductor region 104. In embodiments where the first semiconductor region 104 is made of n-type silicon, the second contact layer 120 may include one or a combination of Ti, W, TiW, Ta, V, Ag, Zr, TiSi, CoSi, for example. In embodiments where the first semiconductor region 104 is made of p-type silicon, the second contact layer 120 may include one or a combination of Al, AlSi, AlSiCu, Pt, PtSi, Pd, Ni, Co, Rh, for example.

Further processes may be carried out, for example together with processes described with reference to FIG. 4A to 4H, before processes described with reference to FIGS. 4A to 4H, after processes described with reference to FIGS. 4A to 4H, between processes described with reference to FIGS. 4A to 4H. These further processes may be part of a manufacturing method of the semiconductor device.

Figure 5:
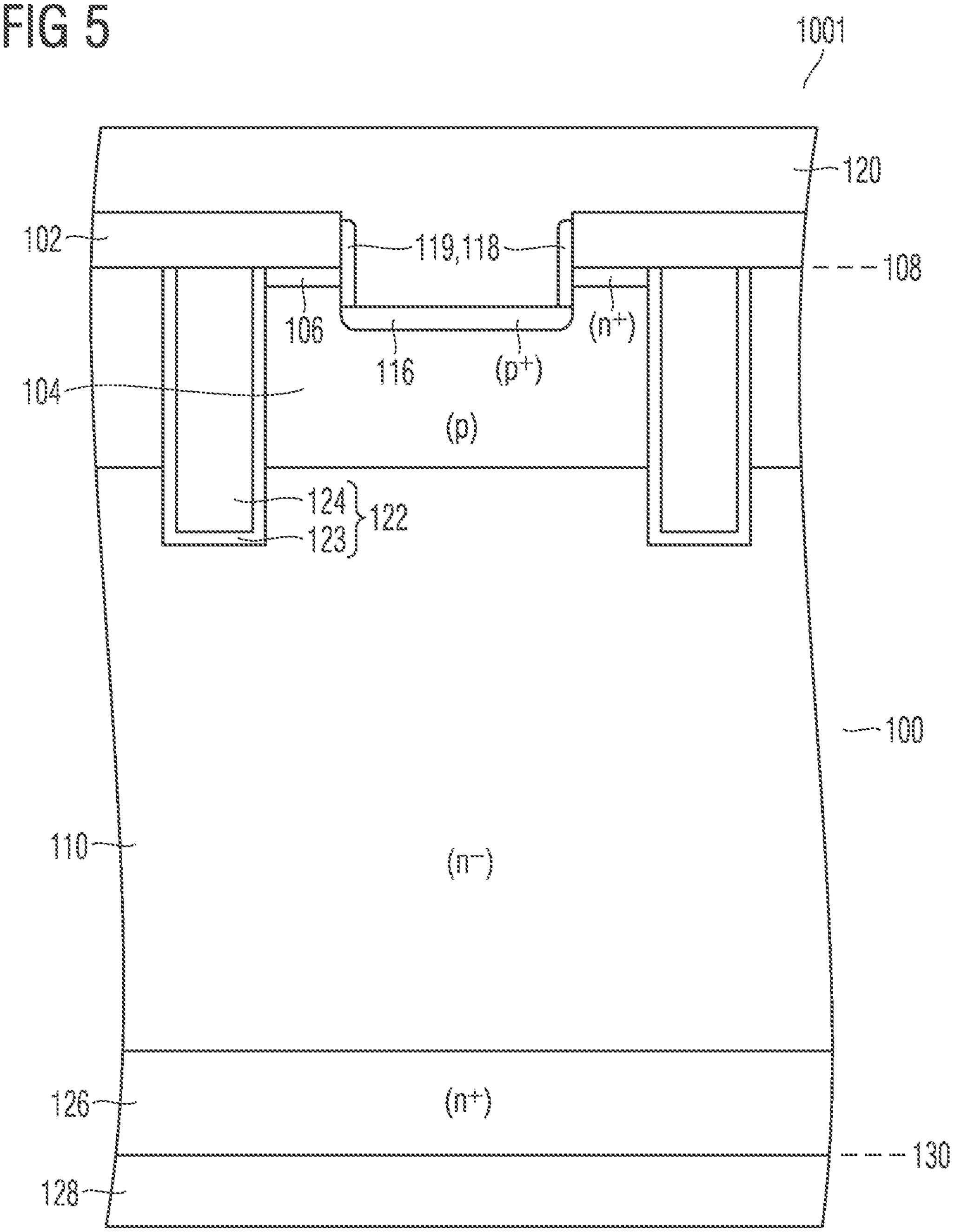
FIG. 5 is a schematic cross sectional view of a vertical trench insulated gate field effect transistor that may be manufactured by a method including process features as described with reference to FIGS. 4A to 4H.
Figure 6:
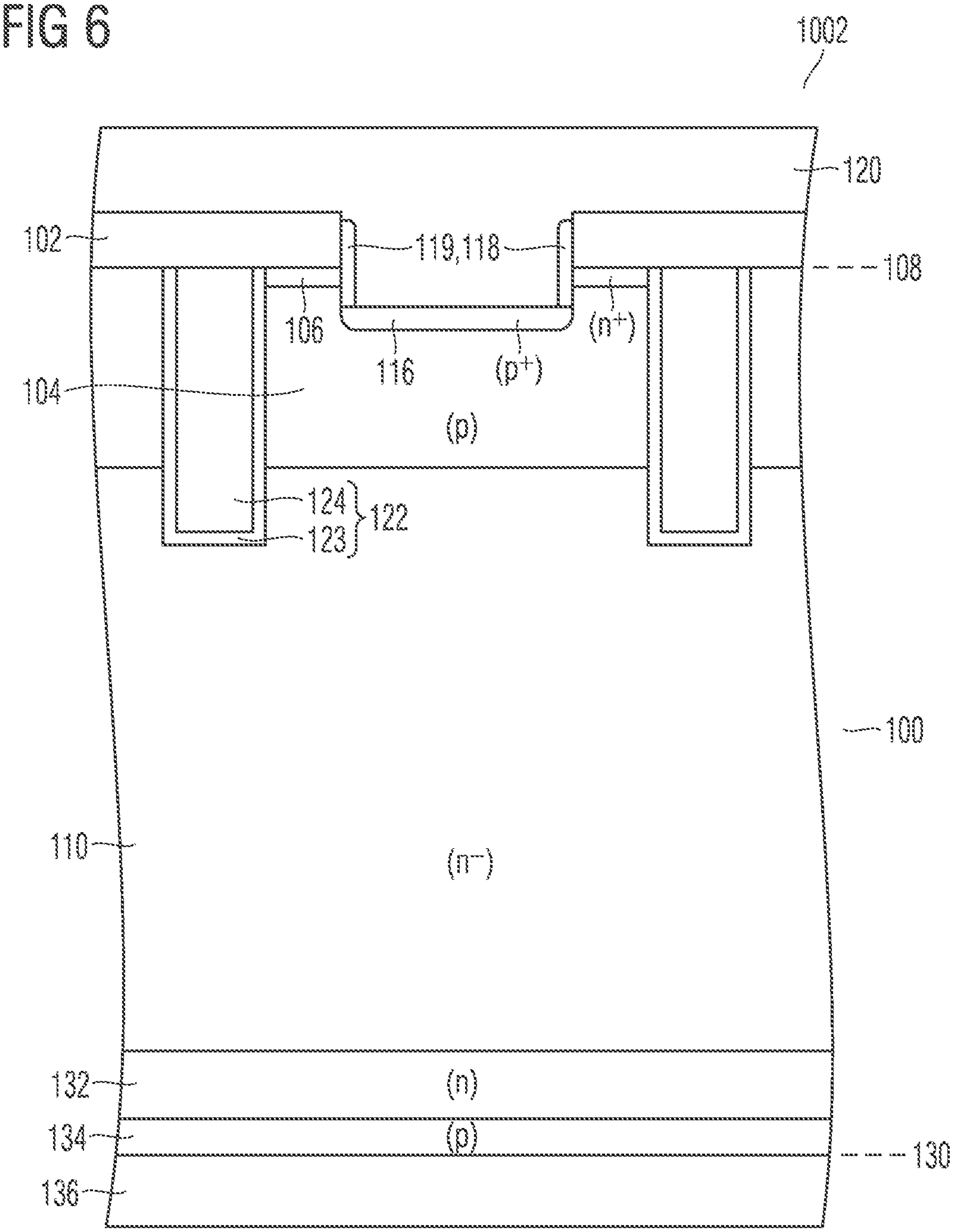
FIG. 6 is a schematic cross sectional view of a vertical trench insulated gate bipolar transistor that may be manufactured by a method including process features as described with reference to FIGS. 4A to 4H.
Figure 7:
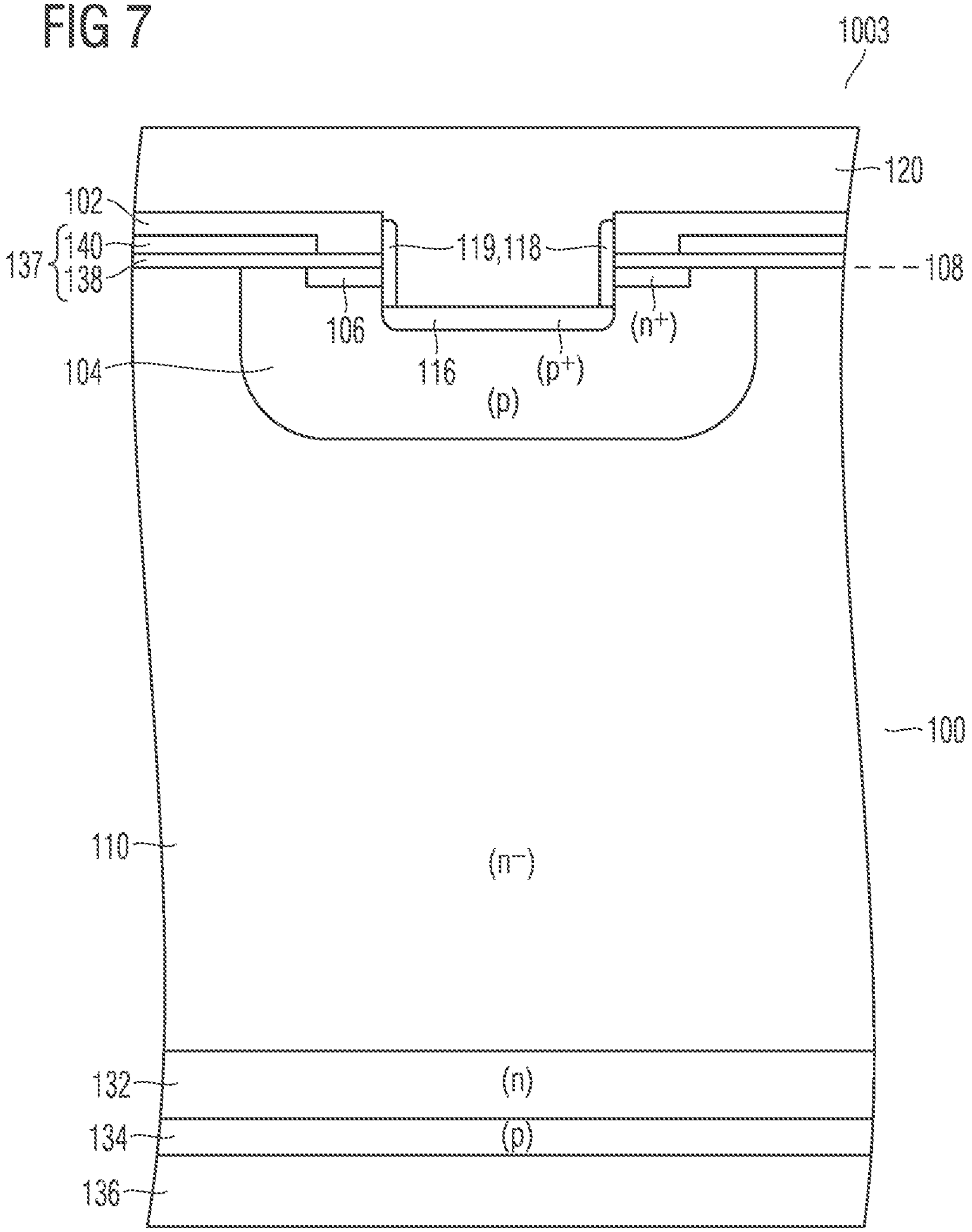
FIG. 7 is a schematic cross sectional view of a vertical planar insulated gate bipolar transistor that may be manufactured by a method including process features as described with reference to FIGS. 4A to 4H.

Some embodiments of semiconductor devices manufactured by a process including the process features described with reference to FIGS. 4A to 4H are illustrated in FIGS. 5 to 7.

Referring to the schematic cross-sectional view of FIG. 5, the process features described with reference to FIGS. 4A to 4H are part of a manufacturing method of a vertical trench insulated gate field effect transistor (vertical trench IGFET) 1001. The contact spacers 119 of the first contact layer 118 and the second contact layer 120 constitute a source contact of the vertical trench IGFET 1001. The p-type first semiconductor region 104 constitutes a p-type body region of the vertical trench IGFET 1001. The optional $p^+$-type contact region 116 constitutes an optional $p^+$-type body contact region of the vertical trench IGFET 1001. The $n^+$-type second semiconductor region 106 constitutes an n+-type source region of the vertical trench IGFET 1001.

The vertical trench IGFET 1001 further includes a trench gate structure 122 including a trench gate dielectric 123 and a trench gate electrode 124.

Moreover, the vertical trench IGFET 1001 further includes an n+-type drain contact region 126 electrically connected to a drain contact 128 at a second surface 130 of the semiconductor body opposite to the first surface 108.

Referring to the schematic cross-sectional view of FIG. 6, the process features described with reference to FIGS. 4A to 4H are part of a manufacturing method of a vertical trench insulated gate bipolar transistor (vertical trench IGBT) 1002. The contact spacers 119 of the first contact layer 118 and the second contact layer 120 constitute an emitter contact of the vertical trench IGBT 1002. The p-type first semiconductor region 104 constitutes a p-type body region of the vertical trench IGBT 1002. The optional $p^+$-type contact region 116 constitutes an optional $p^+$-type body contact region of the vertical trench IGBT 1002. The $n^+$-type second semiconductor region 106 constitutes an $n^+$-type source region of the vertical trench IGBT 1002.

The vertical trench IGBT 1002 further includes the trench gate structure 122 including the trench gate dielectric 123 and the trench gate electrode 124.

Moreover, the vertical trench IGBT 1002 further includes an n-type field stop zone 132 and a p-type collector injection region 134 electrically connected to a collector contact 136 at the second surface 130 of the semiconductor body 100.

Referring to the schematic cross-sectional view of FIG. 7, the process features described with reference to FIGS. 4A to 4H are part of a manufacturing method of a vertical planar insulated gate bipolar transistor (vertical planar IGBT) 1003. The vertical planar IGBT 1003 differs from the vertical trench IGBT 1002 of FIG. 2 in that the trench gate structure 122 is replaced by a planar gate structure 137 including a planar gate dielectric 138 and a planar gate electrode 140.

Figure 8A:
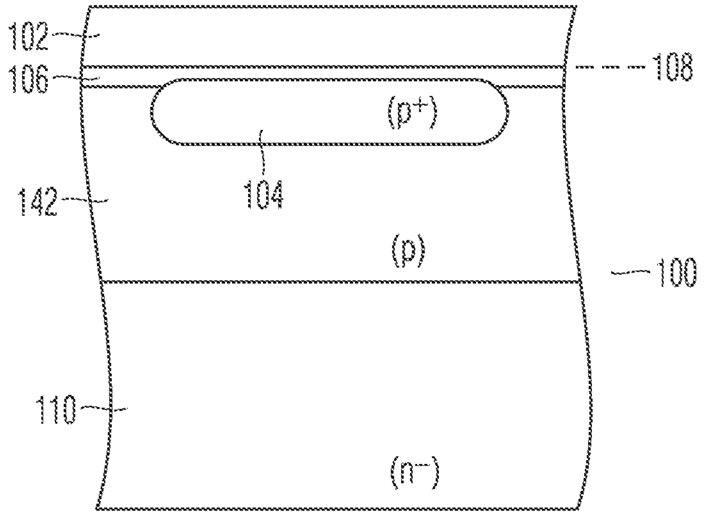
FIG. 8A is a schematic cross-sectional view of a semiconductor body for illustrating another method of manufacturing a semiconductor device.
Figure 8B:
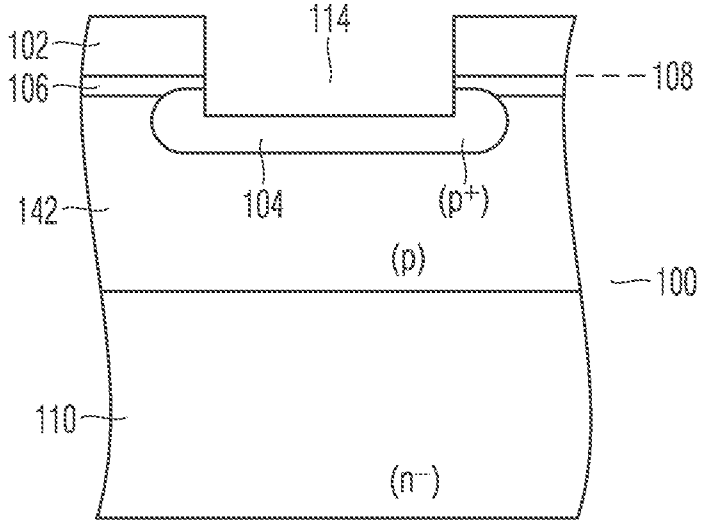
FIG. 8B is a schematic cross-sectional view of the semiconductor body of FIG. 8A after forming a contact trench.
Figure 8C:
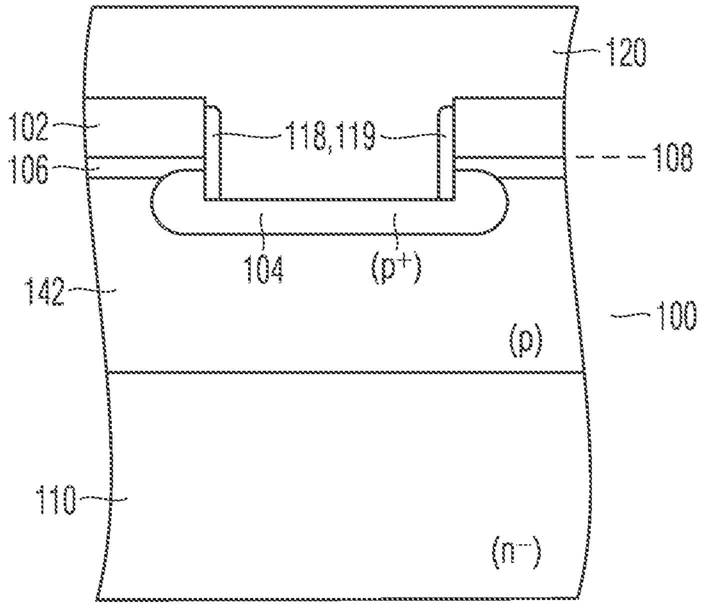
FIG. 8C is a schematic cross-sectional view of the semiconductor body of FIG. 8B after forming a first contact layer and a second contact layer in the contact trench.

FIGS. 8A to 8C illustrate schematic cross-sectional views of a semiconductor body for illustrating another method of manufacturing a semiconductor device.

Referring to the schematic cross-sectional view of FIG. 8A, the first semiconductor region 104 has a higher maximum p-type doping concentration than a body region 142 surrounding the first semiconductor region 104. The first semiconductor region 104 may be formed before formation of the interlayer dielectric 102, for example by ion implantation and/or diffusion of dopants through the first surface 108. The first and second semiconductor regions 104, 106 may overlap along a vertical direction perpendicular to the first surface 108, for example.

In a finalized semiconductor device, the first semiconductor region 104 may allow for reducing latch-up that may be caused by a parasitic base current of a parasitic bipolar transistor flowing through the body region 142 to an electric contact of the source and body region at the first surface 108. The parasitic bipolar transistor is defined by the source region as an emitter and the body region as a base and triggering of the parasitic bipolar transistor may be hindered by the first semiconductor region 104 providing a low resistive current path for the base current.

The process illustrated with reference to FIG. 8B is similar to the process illustrated in FIG. 4D for forming a contact trench 114 extending into the first semiconductor region 104.

The process illustrated with reference to FIG. 8C is similar to the process illustrated in FIG. 4H for forming the second contact layer 120.

In addition to the process illustrated with reference to FIGS. 8A to 8C, further processes, for example processes similar to processes described with reference to FIGS. 4B to 4H, may be carried out for manufacturing semiconductor devices, for example semiconductor devices as illustrated in the schematic cross-sectional views of FIGS. 5 to 7.

Figure 9A:
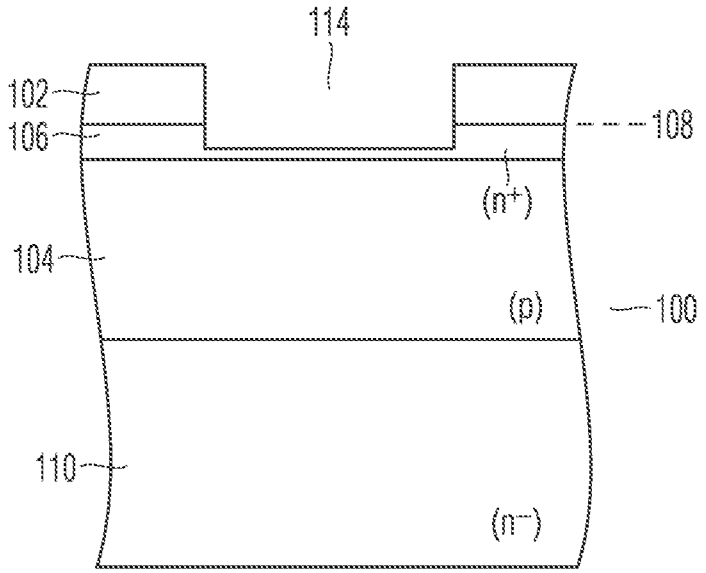
FIG. 9A is a schematic cross-sectional view of a semiconductor body for illustrating yet another method of manufacturing a semiconductor device.
Figure 9B:
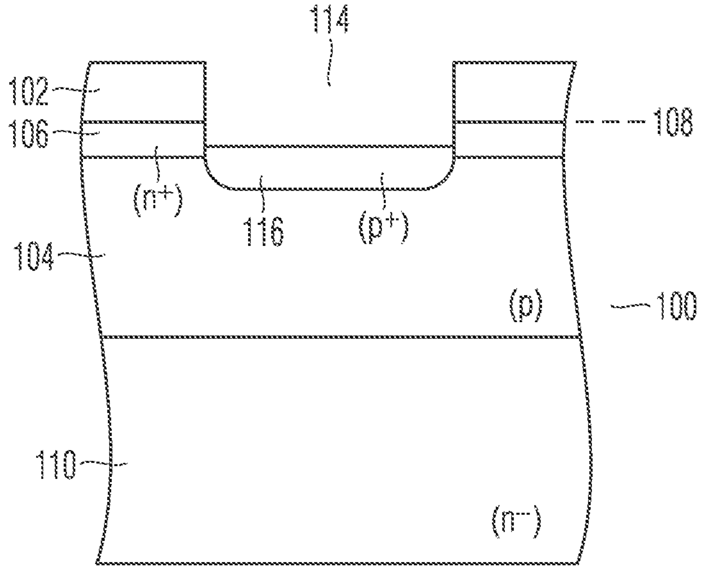
FIG. 9B is a schematic cross-sectional view of the semiconductor body of FIG. 9A after forming a contact region at a bottom of a contact trench.
Figure 9C:
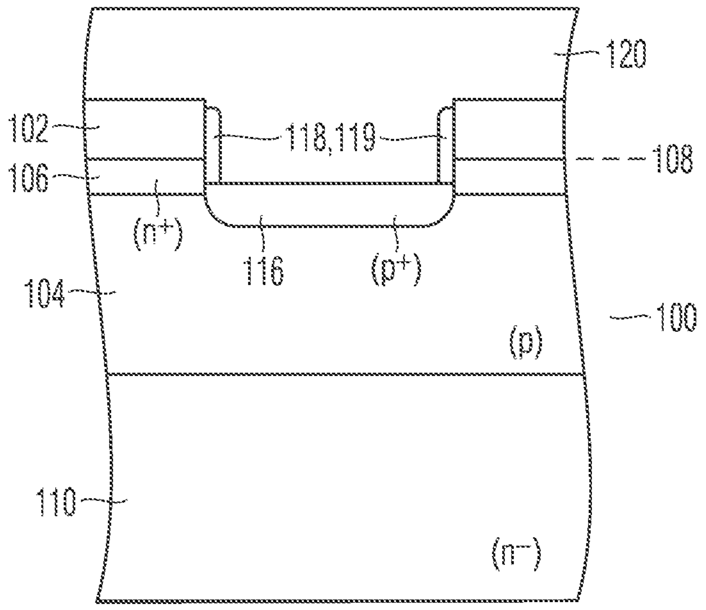
FIG. 9C is a schematic cross-sectional view of the semiconductor body of FIG. 9B after forming a first contact layer and a second contact layer in the contact trench.

FIGS. 9A to 9C illustrate schematic cross-sectional views of a semiconductor body for illustrating yet another method of manufacturing a semiconductor device.

Referring to the schematic cross-sectional view of FIG. 9A, etching of the contact trench 114 into the semiconductor body 100 is stopped within the second semiconductor region 106. Thus, a bottom of the contact trench 114 lies within the second semiconductor region 106.

Referring to the schematic cross-sectional view of FIG. 9B, the $p^+$-type contact region 116 is formed by introducing p-type dopants through a bottom of the contact trench 114 into the semiconductor body 100. An amount of dopants introduced through the bottom of the contact trench 114 may be appropriately chosen to turn the $n^+$-doping of the second semiconductor region 106 at the bottom of the contact trench 114 into a $p^+$-doping. This allows for electrically connecting the first semiconductor region 104 via a bottom of the contact trench 114.

The process illustrated with reference to FIG. 9C is similar to the process illustrated in FIG. 4H for forming the second contact layer 120.

In addition to the process illustrated with reference to FIGS. 9A to 9C, further processes, for example processes similar to processes described with reference to FIGS. 4B to 4H, may be carried out for manufacturing semiconductor devices, for example semiconductor devices as illustrated in the schematic cross-sectional views of FIGS. 5 to 7.

FIGS. 10A to 10G illustrate schematic cross-sectional views of a semiconductor body for illustrating another method of manufacturing a semiconductor device.

Figure 10A:
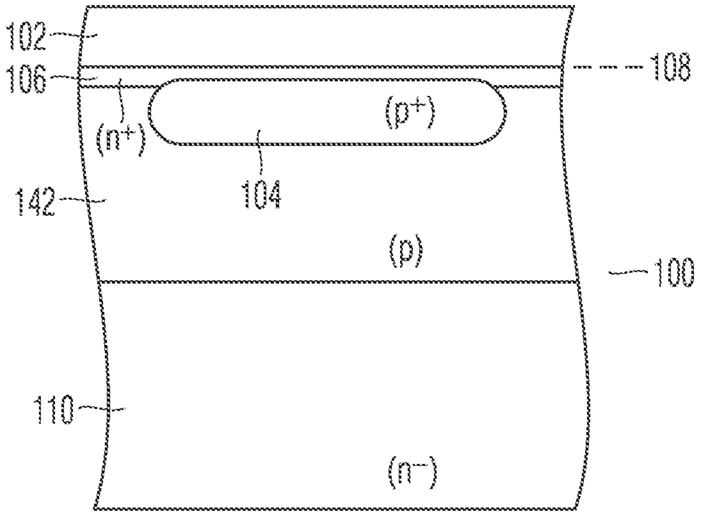
FIG. 10A is a schematic cross-sectional view of a semiconductor body for illustrating another method of manufacturing a semiconductor device.

Referring to the schematic cross-sectional view of FIG. 10A, the first semiconductor region 104 has a higher maximum p-type doping concentration than a body region 142 surrounding the first semiconductor region 104 similar to the embodiment illustrated in FIG. 8A. The first semiconductor region 104 may be formed before formation of the interlayer dielectric 102, for example by ion implantation and/or diffusion of dopants through the first surface 108. The first and second semiconductor regions 104, 106 may overlap along a vertical direction perpendicular to the first surface 108, for example.

Figure 10B:
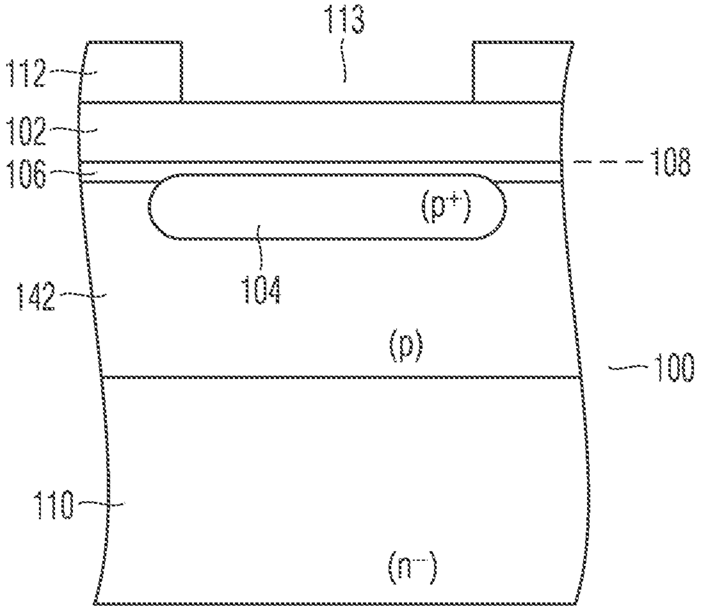
FIG. 10B is a schematic cross-sectional view of the semiconductor body of FIG. 10A after patterning a mask layer.

Referring to the schematic cross-sectional view of FIG. 10B, the mask layer 112 is formed on the interlayer dielectric 102. The mask layer 112 may be a hard mask layer, for example a dielectric layer that can be selectively patterned with respect to a material of the interlayer dielectric 102. In this case, an opening 113 in the hard mask layer may be formed by photolithography using a resist mask pattern above the hard mask layer (not illustrated in FIG. 10B). The mask layer 112 may also be a resist mask layer that is patterned by photolithography for providing the opening 113.

Figure 10C:
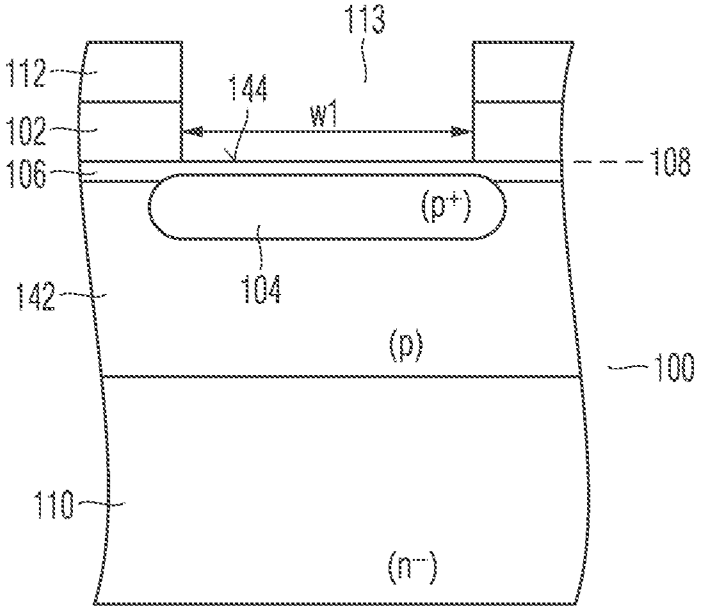
FIG. 10C is a schematic cross-sectional view of the semiconductor body of FIG. 10B after etching an opening into an interlayer dielectric.

Referring to the schematic cross-sectional view of FIG. 10C, the opening 113 is enlarged toward the first surface 108 by extending the opening through the interlayer dielectric 102, for example by an etch process. The opening 113 may be formed in the course of providing the patterned mask layer 112, i.e. by a single etch process that removes material of both the mask layer 112 and the interlayer dielectric 102, for example. In some other embodiments, the opening 113 in the mask layer 112 and in the interlayer dielectric 102 may be formed by separate etch processes carried out one after another, for example. The opening 113 exposes a surface portion 144 of the second semiconductor region 106.

Figure 10D:
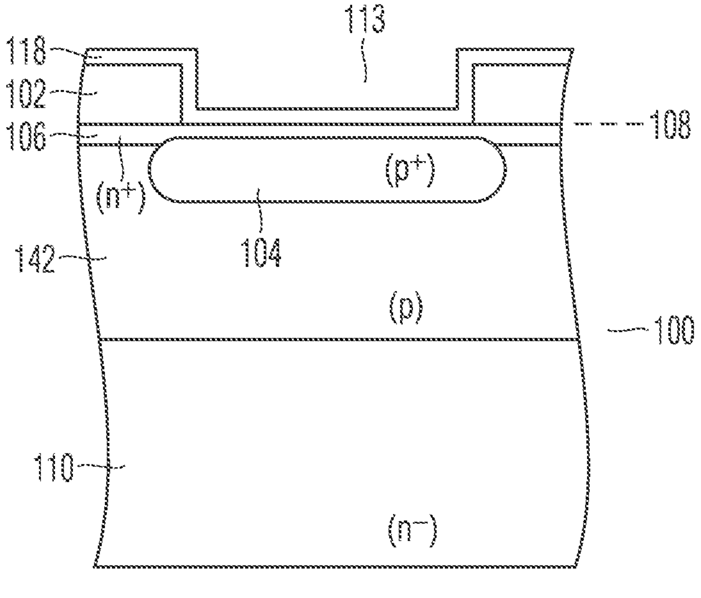
FIG. 10D is a schematic cross-sectional view of the semiconductor body of FIG. 10C after forming a first contact layer lining sidewalls and a bottom of the opening.

Referring to the schematic cross-sectional view of FIG. 10D, the mask layer 112 is removed and the first contact layer 118 is formed on the interlayer dielectric 102 and lines sidewalls and a bottom side of the opening 113. The first contact layer 118 is directly electrically connected to the second semiconductor region 106 at the exposed surface portion 144 of FIG. 10C. Thus, the opening 113 extends up to or slightly into the second semiconductor region 106 for exposing the surface portion 144 that serves as the electrical contact area for the first contact layer 118.

Figure 10E:
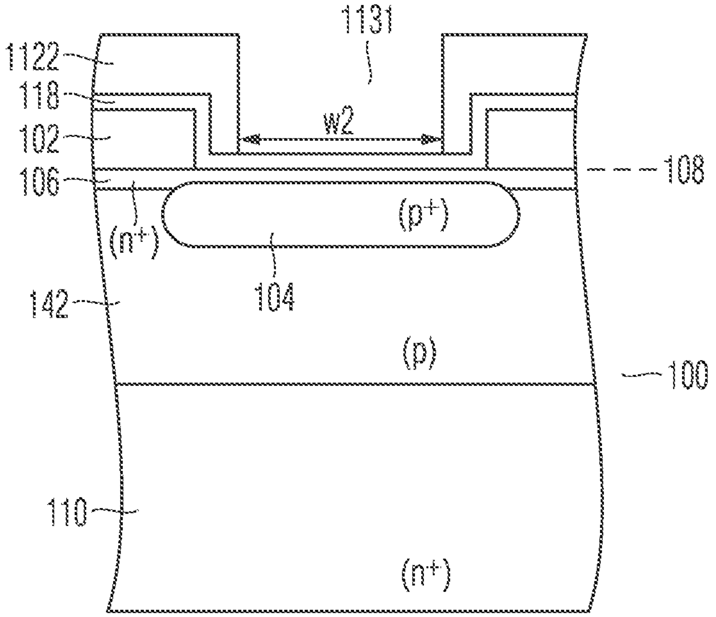
FIG. 10E is a schematic cross-sectional view of the semiconductor body of FIG. 10D after forming a further mask layer with a further opening that exposes part of the first contact layer.

Referring to the schematic cross-sectional view of FIG. 10E, a further mask layer 1122 is formed over the first surface 108 and is patterned into a further opening 1131 that exposes part of the first contact layer 118. A width w2 of the further opening 1131 may be smaller than a width w1 of the opening 113 illustrated in FIG. 10C. A thickness of the first contact layer 118 may be at most one-third of a width of the contact trench at a bottom side of the further opening 1131, for example.

Figure 10F:
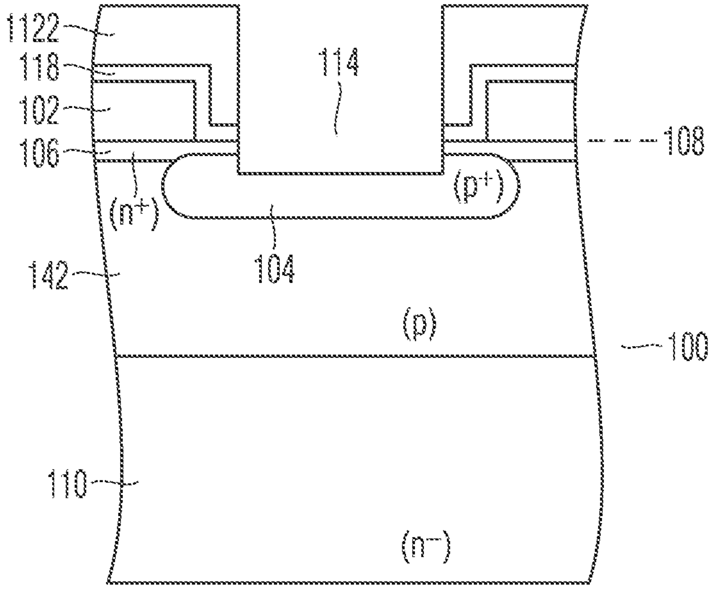
FIG. 10F is a schematic cross-sectional view of the semiconductor body of FIG. 10E after forming a contact trench extending through the first contact layer and into the semiconductor body.

Referring to the schematic cross-sectional view of FIG. 10F, the further opening 1131 is further enlarged into the semiconductor body 100, thereby forming the contact trench 114 into the semiconductor body 100. The contact trench 114 extends through the first contact layer 118 and through the second semiconductor region 106 and ends on top of or within the first semiconductor region 104. The contact trench 114 may be formed into the semiconductor body 100 by continuing with the etch process that removed material of the further mask layer 1122 and/or the first contact layer 118, for example. In some other embodiments, different etch processes may be used for removing material of the further mask layer 1122, the first contact layer 118 and the second semiconductor region 106, for example. The further mask layer 1122 may also be a resist patterned by lithography.

Figure 10G:
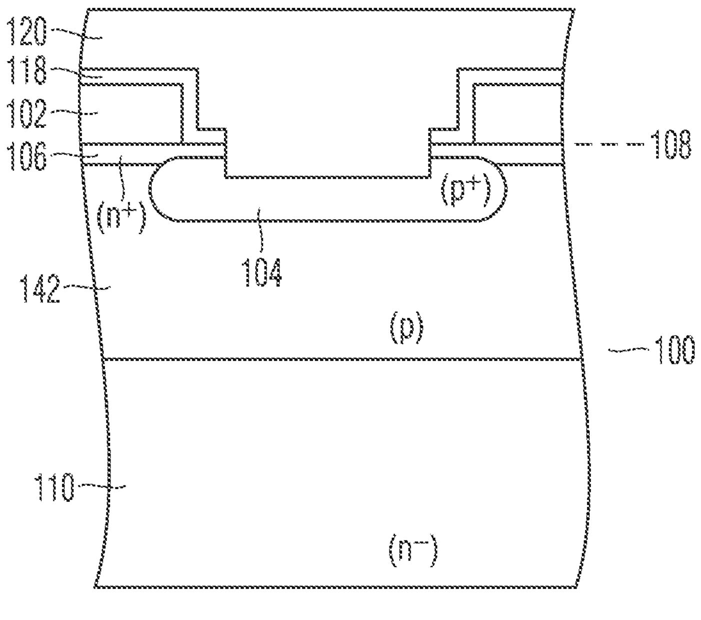
FIG. 10G is a schematic cross-sectional view of the semiconductor body of FIG. 10F after forming a second contact layer in the contact trench.

Referring to the schematic cross-sectional view of FIG. 10G, the second contact layer 120 is formed in the contact trench 114, for example by a layer deposition process such as chemical vapor deposition (CVD), by sputtering, or by physical vapor deposition (PVD). The second contact layer 120 may be formed by a single material or by a stack of different materials, for example. A material of the second contact layer 120 may be selected with respect to a desired electrical contact to the first semiconductor region 104. In embodiments where the first semiconductor region 104 is made of n-type silicon, the second contact layer 120 may include one or a combination of Ti, W, TiW, Ta, V, Ag, Zr, TiSi, CoSi, for example. In embodiments where the first semiconductor region 104 is made of p-type silicon, the second contact layer 120 may include one or a combination of Al, AlSi, AlSiCu, Pt, PtSi, Pd, Ni, Co, Rh, for example.

Further processes may be carried out, for example together with processes described with reference to FIGS.

10A to 10G, before processes described with reference to FIGS. 10A to 10G, after processes described with reference to FIGS. 10A to 10G, between processes described with reference to FIGS. 10A to 10G. These further processes may be part of a manufacturing method of the semiconductor device including a trench contact as illustrated in FIG. 10G.

Functional and structural details described with respect to any of the embodiments above shall likewise apply to the exemplary figures described below.

The schematic plan views of FIGS. 11A to 14A are for illustrating another embodiment of manufacturing a semiconductor device. The schematic cross-section views of FIG. 11B to 14B are taken along the cut-line AA' of the corresponding plan view, and the schematic cross-section views of FIG. 11C to 14C are taken along the cut-line BB' of the corresponding plan view.

Figure 11A:
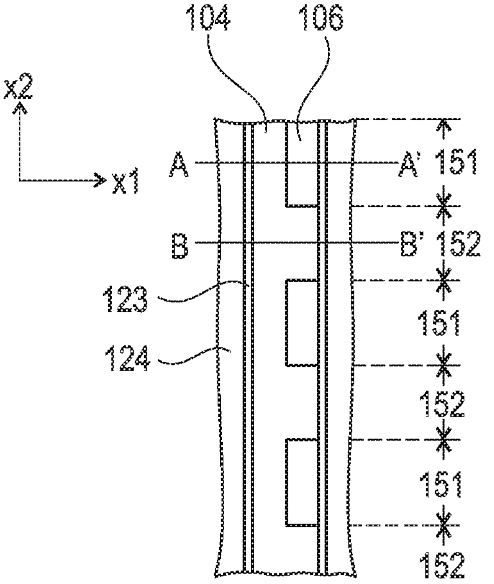
FIGS. 11A, 12A, 13A, and 14A are plan views for illustrating another embodiment of manufacturing a semiconductor device, wherein the schematic cross-section views of FIGS. 11B, 12B, 13B, and 14B are taken along the cut-line AA' of the corresponding plan view, and the schematic cross-section views of FIGS. 11C, 12C, 13C, and 14C are taken along the cut-line BB' of the corresponding plan view.
Figure 11B:
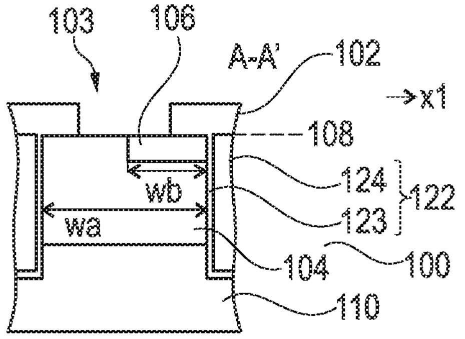
Figure 11C:
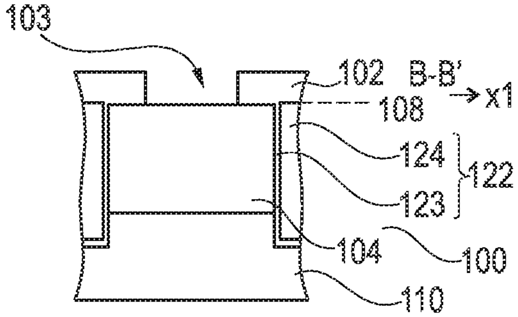

Referring to the schematic plan view of FIG. 11A and to the schematic cross-sectional views of FIGS. 11B and 11C, a semiconductor body 100 is provided, wherein the semiconductor body 100 includes a first semiconductor region 104 of a first conductivity type, e.g. a body region, and second semiconductor regions 106 of a second conductivity type, e.g. a source region. The second semiconductor regions 106 are separated from each other and interposed between the first semiconductor region 104 and a first surface 108 of the semiconductor body in first parts 151 of the first semiconductor region 104. The first parts 151 of the first semiconductor region 104 and second parts 152 of the first semiconductor region 104 are alternately arranged along a longitudinal direction x2 of the first semiconductor region 104. A first dimension wa of the first semiconductor region 104 along a lateral direction x1 perpendicular to the longitudinal direction x2 is larger than a second dimension wb of the second semiconductor regions 106 along the lateral direction x1. A trench gate structure 122 including a trench gate dielectric 123 and a trench gate electrode 124 extends from the first surface 108 into the semiconductor body 100.

The semiconductor body 100 may include a semiconductor substrate 110 having none, one or more optional epitaxial layers thereon. The semiconductor body 100 may also include one or more doped semiconductor regions formed therein, e.g. the first semiconductor region 104 and the second semiconductor regions 106. The semiconductor body 100 may be a silicon semiconductor body, for example a Czochralski (CZ) silicon semiconductor body such as a magnetic Czochralski (MCZ) silicon semiconductor body, or a Float-Zone (FZ) silicon semiconductor body, for example. In some embodiments, a material of the semiconductor body is another single-crystalline semiconductor material such as silicon carbide (SiC), gallium arsenide (GaAs), gallium nitride (GaN) or another $A_{III}B_V$ semiconductor, germanium (Ge) or a silicon germanium (Site).

Referring to the schematic cross-sectional views of FIGS. 11B and 11C, an interlayer dielectric 102 is formed on the semiconductor body 100. The interlayer dielectric 102 may include one or a stack of dielectric materials, for example oxide(s), nitride(s), high-k dielectric(s), low-k dielectric(s). The interlayer dielectric may be formed by any suitable layer formation technique including chemical vapor deposition (CVD) and thermal oxidation. The interlayer dielectric 102 is patterned and includes and opening 103 that exposes part of the semiconductor body 100 at the first surface 108.

Figure 12A:
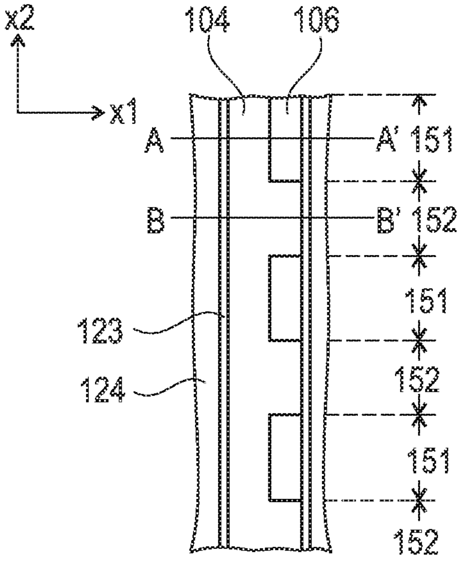
Figure 12B:
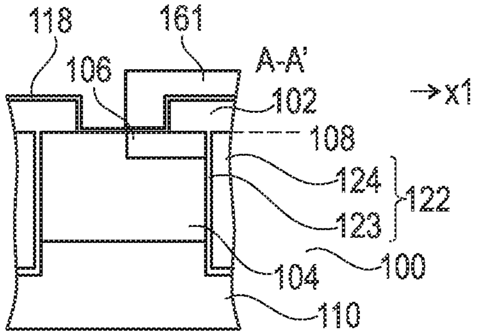
Figure 12C:
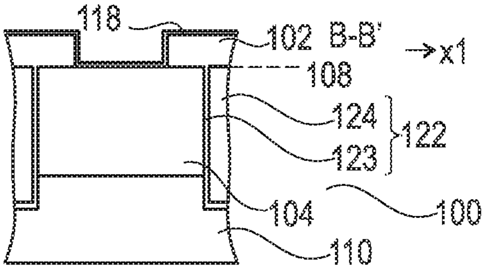

Referring to the schematic plan view of FIG. 12A and to the schematic cross-sectional views of FIGS. 12B and 12C, a first contact layer 118 is formed in direct electrical contact to the second semiconductor regions 106 in the first parts 151. The first contact layer 118 is also formed on the semiconductor body 100 at the first surface 108 in the second parts 152. A mask pattern 161 is formed on the first contact layer 118, e.g. by a photolithographic process. The mask pattern 161 covers the first contact layer 118 on the second semiconductor regions 106 in the first parts 151 and exposes the first contact layer 118 on the first semiconductor region 104 in other areas of the first and second parts 151, 152.

Figure 13A:
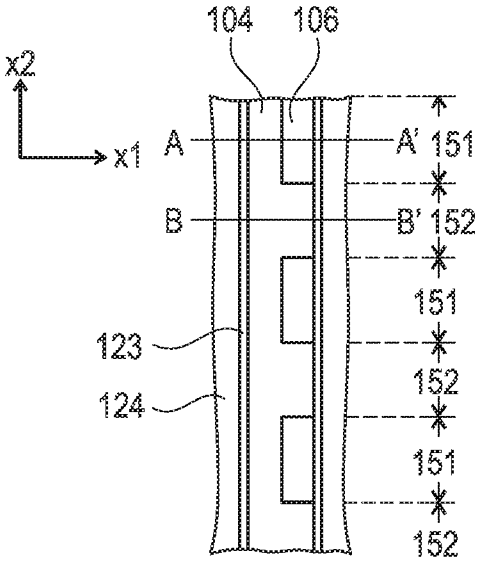
Figure 13B:
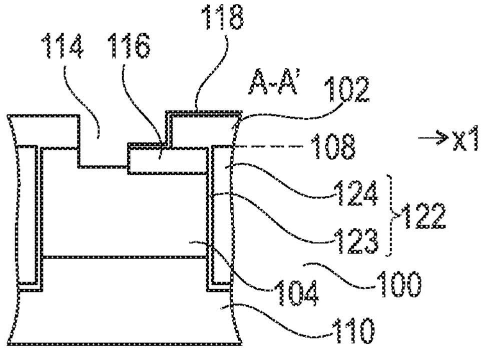
Figure 13C:
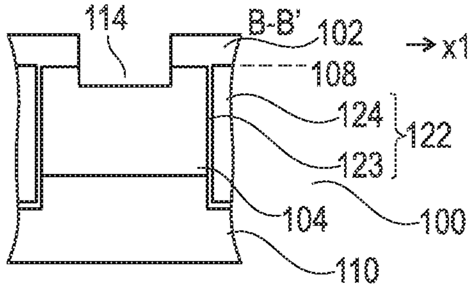

Referring to the schematic plan view of FIG. 13A and to the schematic cross-sectional views of FIGS. 13B and 13C, the exposed parts of the first contact layer 118 on the first semiconductor region 104 in the first and second parts 151, 152 are removed, e.g. by one or more etch processes, and the mask pattern 161 is removed. A contact region similar to the $p^+$-type contact region 116 illustrated in FIG. 4F may be formed by one or more ion implantation and/or diffusion processes, e.g. by using the mask pattern 161 as a mask. The contact region may improve an ohmic contact between the first semiconductor region 104, e.g. a body region and a second contact layer 120 described with reference to FIGS. 14B and 14C. The contact region may also be formed in the other embodiments described herein. When removing the exposed parts of the first contact layer 118, an etch process may terminate on the semiconductor body 100, or may extend into the semiconductor body 100, thereby leading to a contact trench 114 as is schematically illustrated in FIGS. 13B, 13C. The contact trench 114 may also be dispensed with.

Figure 14A:
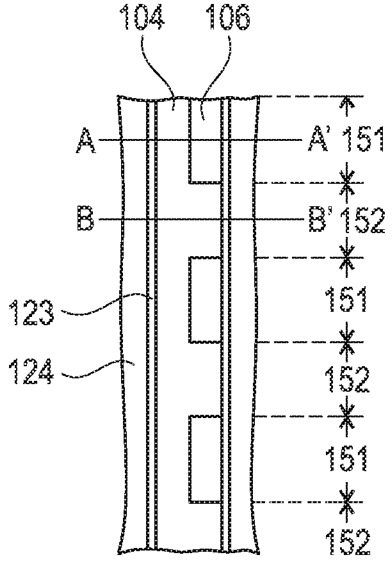
Figure 14B:
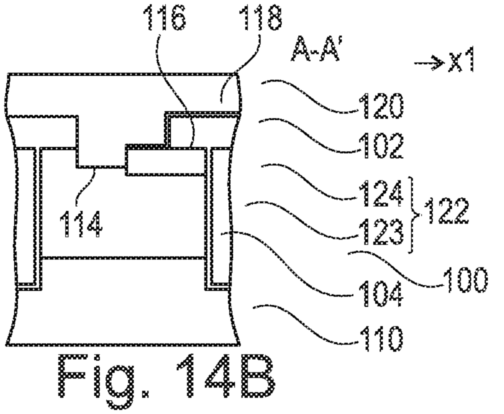
Figure 14C:
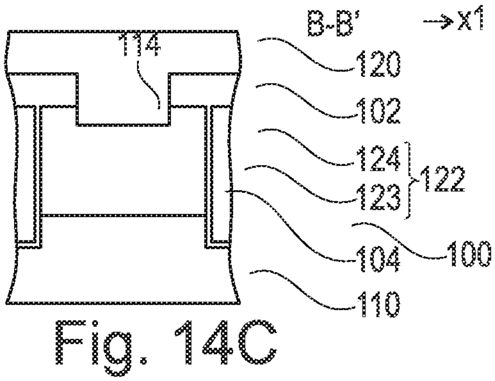

Referring to the schematic plan view of FIG. 14A and to the schematic cross-sectional views of FIGS. 14B and 14C, the second contact layer 120 is formed in direct electrical contact to the first semiconductor region 104 in the first and second parts 151, 152. The second contact layer 120 is also formed directly on the first contact layer 118.

The schematic plan views of FIGS. 15A to 18A are for illustrating another embodiment of manufacturing a semiconductor device. The schematic cross-section views of FIGS. 15B to 18B are taken along the cut-line AA' of the corresponding plan view, and the schematic cross-section views of FIGS. 15C to 18C are taken along the cut-line BB' of the corresponding plan view.

Figure 15A:
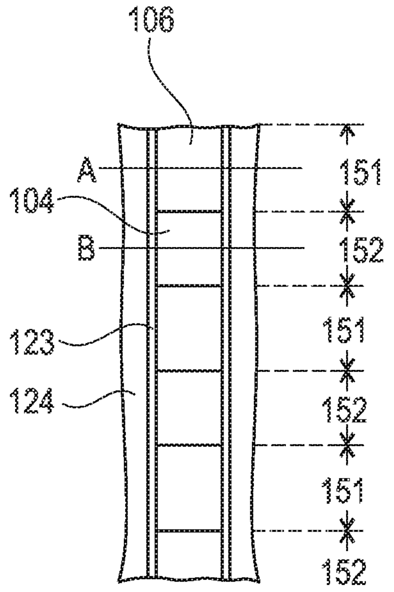
FIGS. 15A, 16A, 17A, and 18A are plan views for illustrating another embodiment of manufacturing a semiconductor device, wherein the schematic cross-section views of FIGS. 15B, 16B, 17B, and 18B are taken along the cut-line AA' of the corresponding plan view, and the schematic cross-section views of FIGS. 15C, 16C, 17C, and 18C are taken along the cut-line BB' of the corresponding plan view.
Figure 15B:
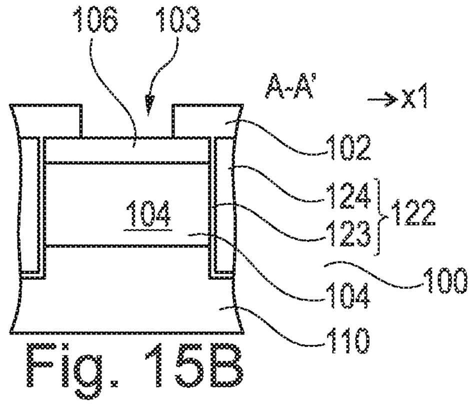
Figure 15C:
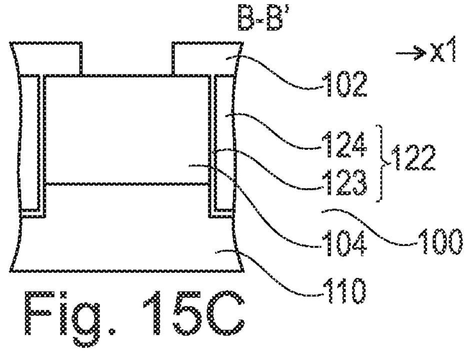

Referring to the schematic plan view of FIG. 15A and to the schematic cross-sectional views of FIGS. 15B and 15C, the semiconductor body 100 is provided, wherein the semiconductor body 100 includes the first semiconductor region 104 of the first conductivity type, e.g. a body region, and the second semiconductor regions 106 of the second conductivity type, e.g. a source region. Different from the embodiment illustrated in FIGS. 11A to 14C, the second semiconductor regions 106 in the first parts 151 extend not only along part of a width of a mesa region between opposite trench gate structures 122, but extend along a total width of the mesa region, i.e. from one of the trench gate structures 122 to an opposite one of the trench gate structures 122.

Figure 16A:
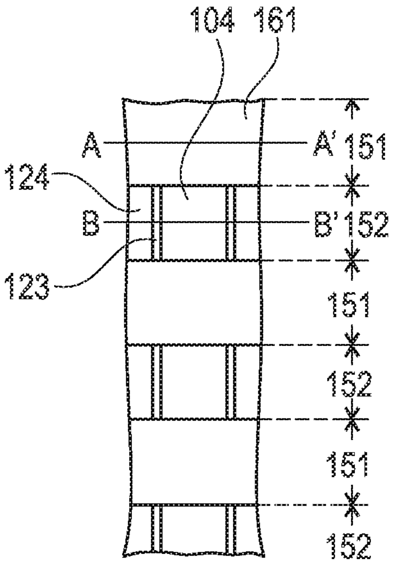
Figure 16B:
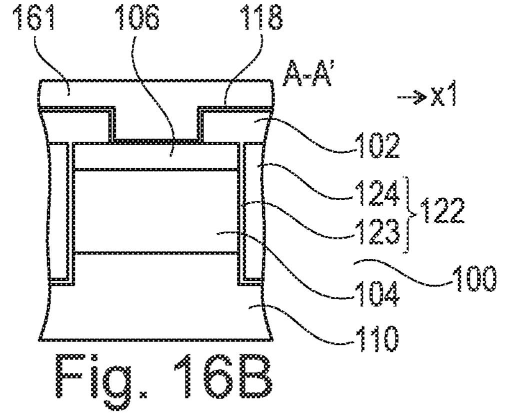
Figure 16C:
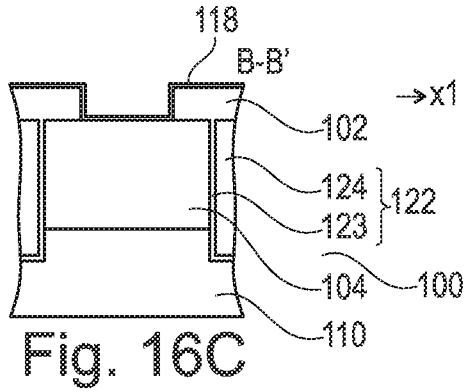

Referring to the schematic plan view of FIG. 16A and to the schematic cross-sectional views of FIGS. 16B and 16C, the first contact layer 118 is formed in direct electrical contact to the second semiconductor regions 106 in the first parts 151. The first contact layer 118 is also formed on the semiconductor body 100 at the first surface 108 in the second parts 152. The mask pattern 161 is formed on the first contact layer 118, e.g. by a photolithographic process. The mask pattern 161 covers the first contact layer 118 in the first parts 151 and exposes the first contact layer 118 in the second parts 152.

Figure 17A:
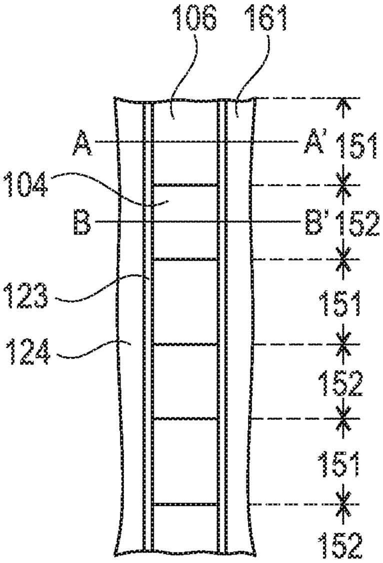
Figure 17B:
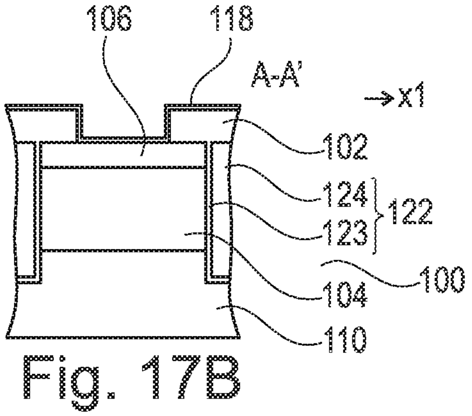
Figure 17C:
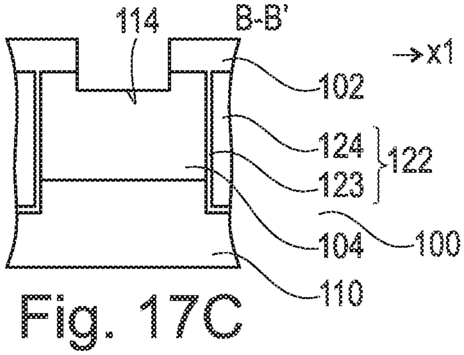

Referring to the schematic plan view of FIG. 17A and to the schematic cross-sectional views of FIGS. 17B and 17C, the exposed first contact layer 118 in the second parts 152 is removed, e.g. by one or more etch processes, and the mask pattern 161 is removed. When removing the exposed first contact layer 118 in the second parts 152, an etch process may terminate on the semiconductor body 100, or may extend into the semiconductor body 100, thereby leading to the contact trench 114 as is schematically illustrated in FIG. 17C. The contact trench 114 may also be dispensed with.

Figure 18A:
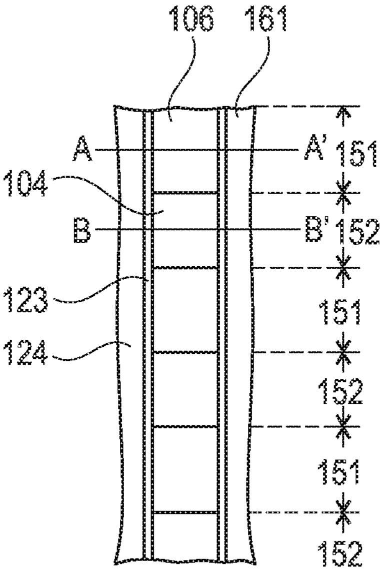
Figure 18B:
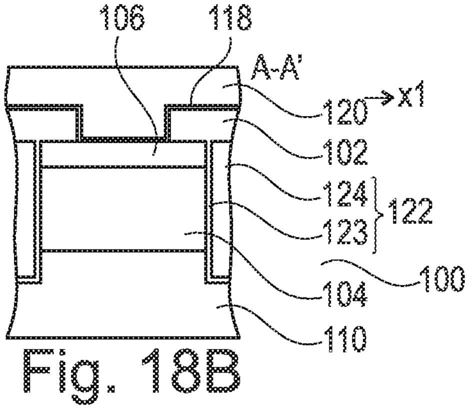
Figure 18C:
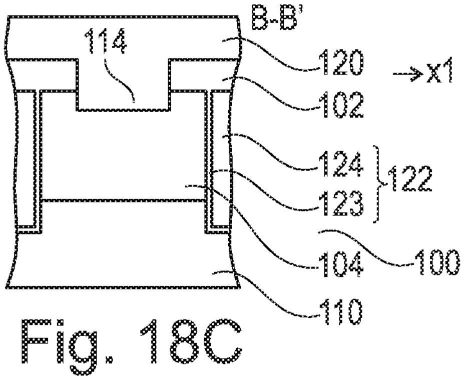
Figure 19A:
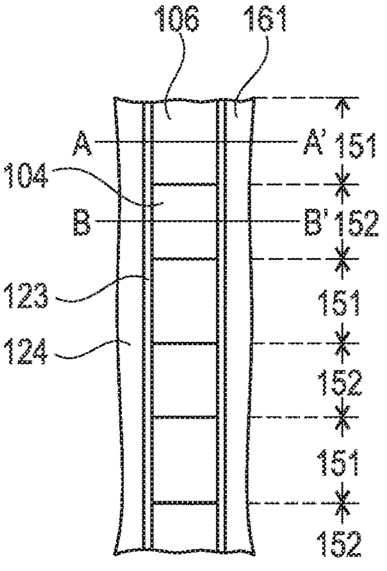
FIGS. 19A, 20A, 21A, and 22A are plan views for illustrating another embodiment of manufacturing a semiconductor device, wherein the schematic cross-section views of FIGS. 19B, 20B, 21B, and 22B are taken along the cut-line AA' of the corresponding plan view, and the schematic cross-section views of FIGS. 19C, 20C, 21C, and 22C are taken along the cut-line BB' of the corresponding plan view.
Figure 19B:
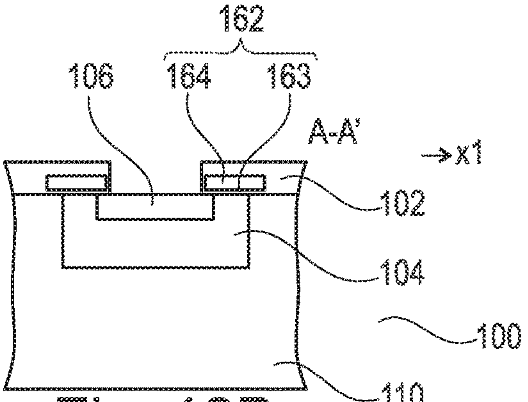
Figure 19C:
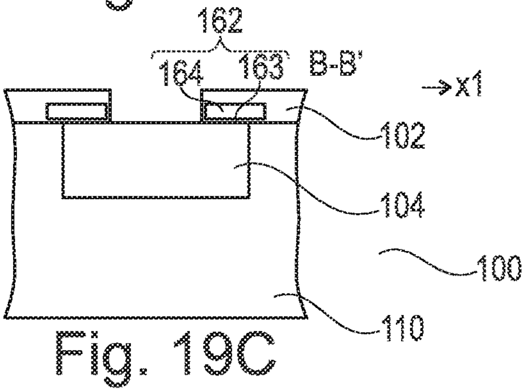
Figure 20A:
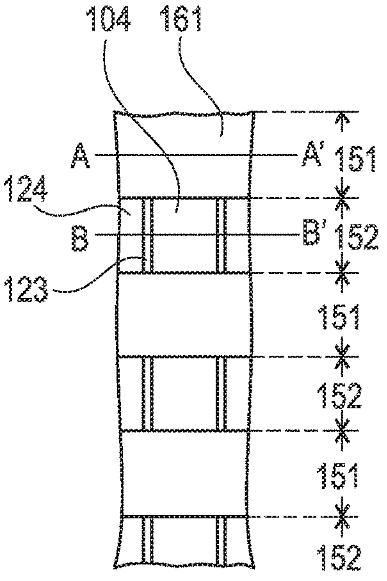
Figure 20B:
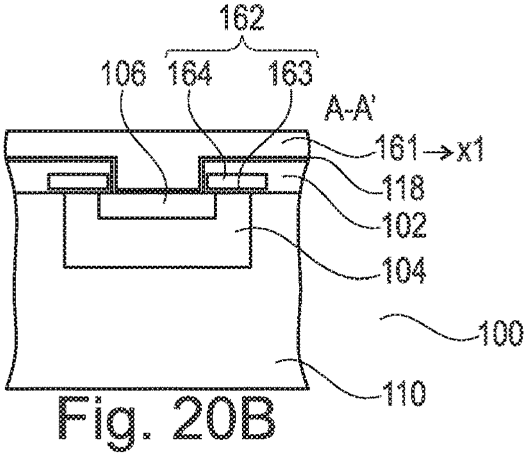
Figure 20C:
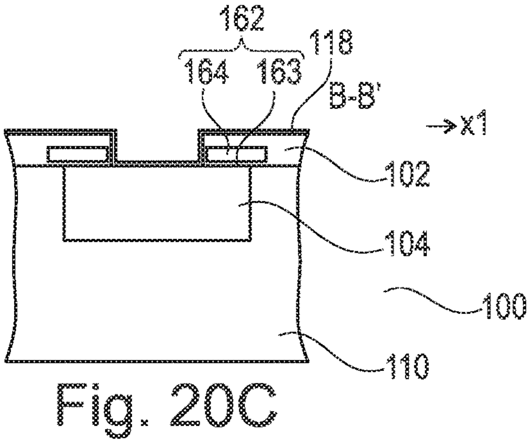
Figure 21A:
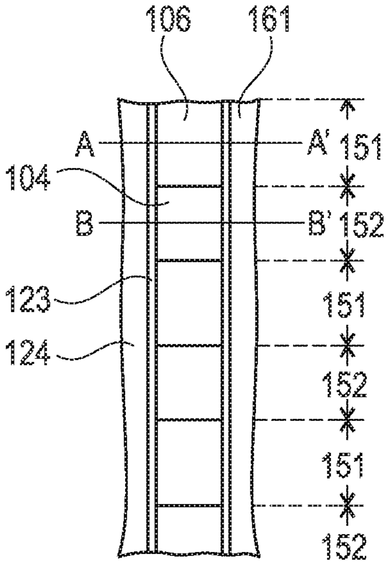
Figure 21B:
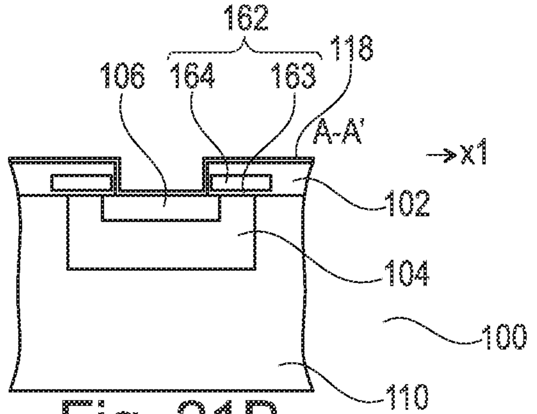
Figure 21C:
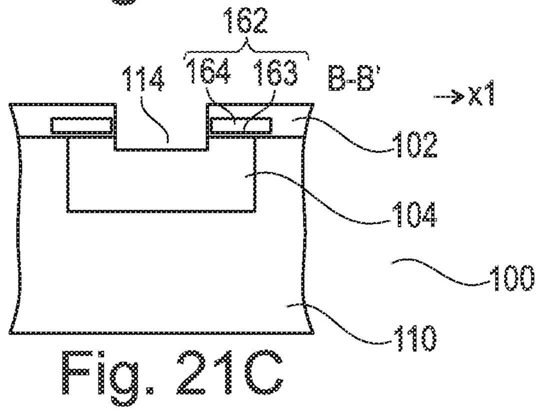
Figure 22A:
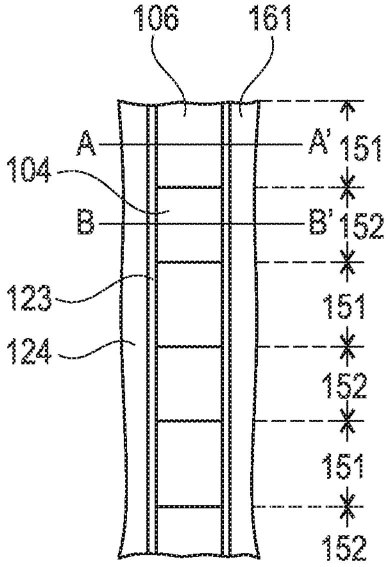
Figure 22B:
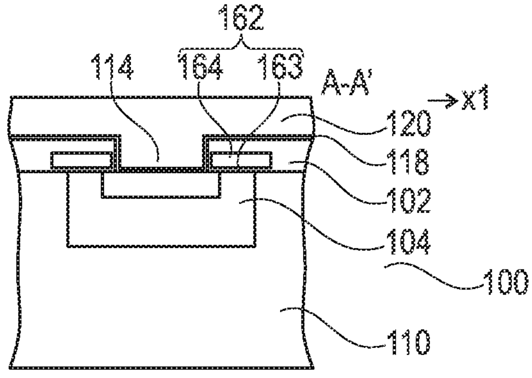
Figure 22C:
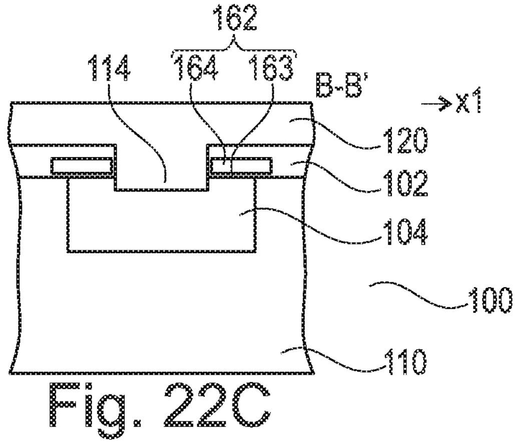

Referring to the schematic plan view of FIG. 18A and to the schematic cross-sectional views of FIGS. 18B and 18C, the second contact layer 120 is formed in direct electrical contact to the first semiconductor region 104 in second parts 152. The second contact layer 120 is also formed directly on the first contact layer 118 in the first parts 151.

The schematic plan views of FIGS. 19A to 22A are for illustrating another embodiment of manufacturing a semiconductor device. The schematic cross-section views of FIGS. 19B to 22B are taken along the cut-line AA' of the corresponding plan view, and the schematic cross-section views of FIGS. 19C to 22C are taken along the cut-line BB' of the corresponding plan view. The process features illustrated in FIGS. 19A to 22C are similar to the process features illustrated in FIGS. 15A to 18C with respect to manufacturing of the first and second contact layers 118, 120. Different from the embodiment illustrated in FIGS. 15A to 18C, the embodiment illustrated in FIGS. 19A to 22C is a planar gate FET that includes a planar gate structure 162 comprising a planar gate dielectric 163 and a planar gate electrode 164.

The schematic plan views of FIGS. 23A to 26A are for illustrating another embodiment of manufacturing a semiconductor device. The schematic cross-section views of FIGS. 23B to 26B are taken along the cut-line AA' of the corresponding plan view, and the schematic cross-section views of FIGS. 23C to 26C are taken along the cut-line BB' of the corresponding plan view.

Figure 23A:
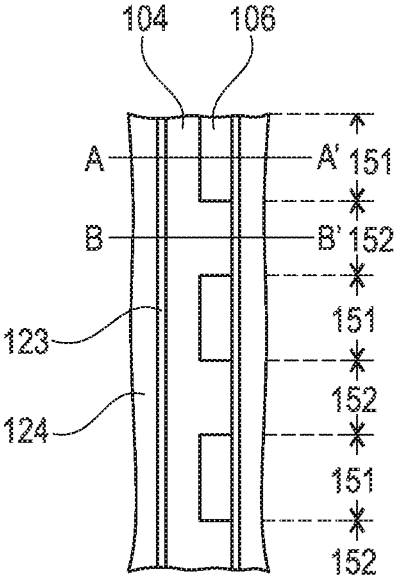
FIGS. 23A, 24A, 25A, and 26A are plan views for illustrating another embodiment of manufacturing a semiconductor device, wherein the schematic cross-section views of FIGS. 23B, 24B, 25B, and 26B are taken along the cut-line AA' of the corresponding plan view, and the schematic cross-section views of FIGS. 23C, 24C, 25C, and 26C are taken along the cut-line BB' of the corresponding plan view.
Figure 23B:
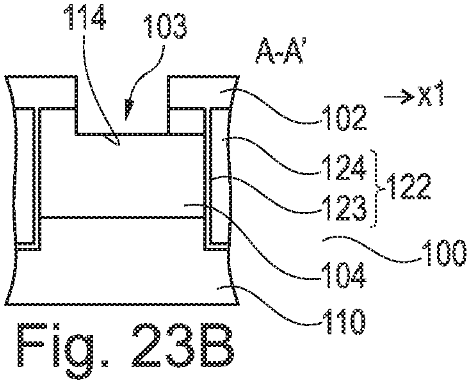
Figure 23C:
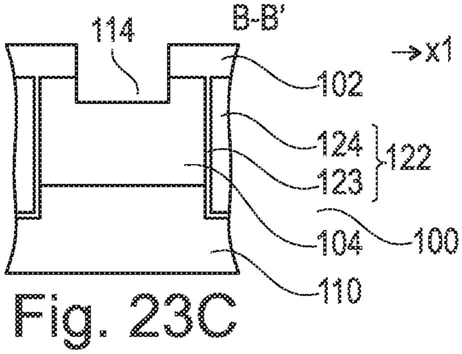

Referring to the schematic plan view of FIG. 23A and to the schematic cross-sectional views of FIGS. 23B and 23C, the semiconductor body 100 is provided, wherein the semiconductor body 100 includes the first semiconductor region 104 of the first conductivity type, e.g. a body region, and second semiconductor regions 106 of the second conductivity type, e.g. a source region. The second semiconductor regions 106 are separated from each other and interposed between the first semiconductor region 104 and the first surface 108 of the semiconductor body 100 in the first parts 151 of the first semiconductor region 104. The first parts 151 of the first semiconductor region 104 and the second parts 152 of the first semiconductor region 104 are alternately arranged along the longitudinal direction x2 of the first semiconductor region 104. A first dimension wa of the first semiconductor region 104 along the lateral direction x1 perpendicular to the longitudinal direction x2 is larger than a second dimension wb of the second semiconductor regions 106 along the lateral direction x1. The trench gate structure 122 including the trench gate dielectric 123 and the trench gate electrode 124 extends from the first surface 108 into the semiconductor body 100.

Referring to the schematic cross-sectional views of FIGS. 23B and 23C, the interlayer dielectric 102 is formed on the semiconductor body 100. The interlayer dielectric 102 may include one or a stack of dielectric materials, for example oxide(s), nitride(s), high-k dielectric(s), low-k dielectric(s). The interlayer dielectric may be formed by any suitable layer formation technique including chemical vapor deposition (CVD) and thermal oxidation. The interlayer dielectric 102 is patterned and includes the opening 103 that exposes part of the semiconductor body 100 at the first surface 108. The opening 103 is extended into the semiconductor body 100 to form the contact trench 114 in the first and second parts 151, 152. The contact trench 114 exposes a side face of the second semiconductor regions 106.

Figure 24A:
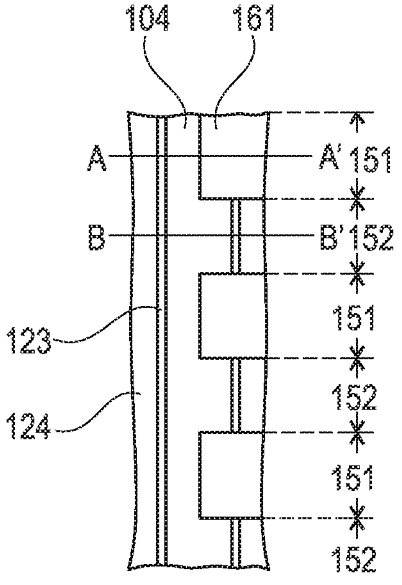
Figure 24B:
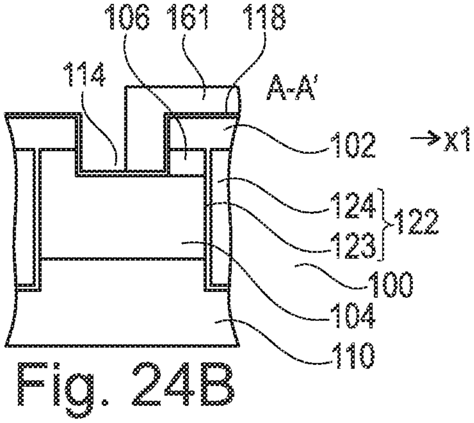
Figure 24C:
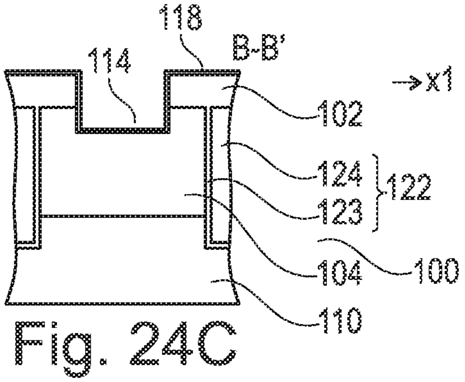

Referring to the schematic plan view of FIG. 24A and to the schematic cross-sectional views of FIGS. 24B and 24C, the first contact layer 118 is formed in direct electrical contact to the side face of the second semiconductor regions 106 in the first parts 151. The first contact layer 118 is also formed on the first semiconductor region 104 in the first and second parts 151, 152. The mask pattern 161 is formed on the first contact layer 118, e.g. by a photolithographic process. The mask pattern 161 covers the first contact layer 118 at the side face of the second semiconductor regions 106 in the first parts 151 and exposes the first contact layer 118 on the first semiconductor region 104 in other areas of the first and second parts 151, 152.

Figure 25A:
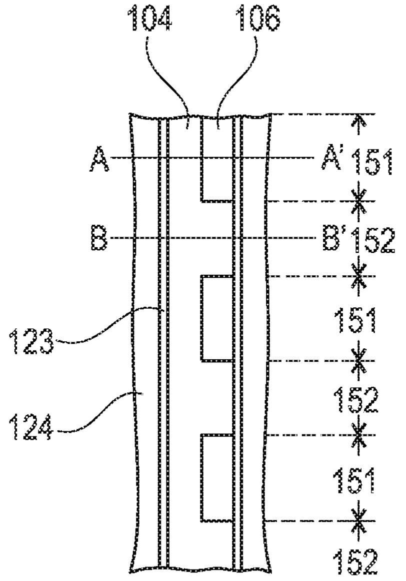
Figure 25B:
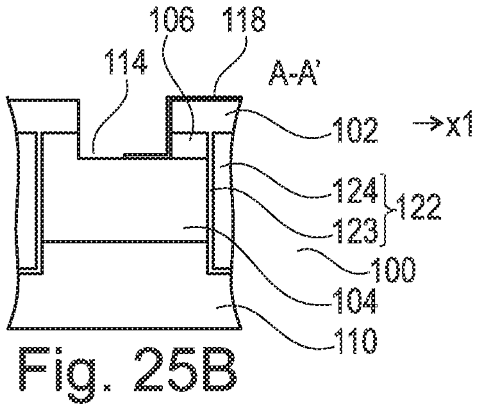
Figure 25C:
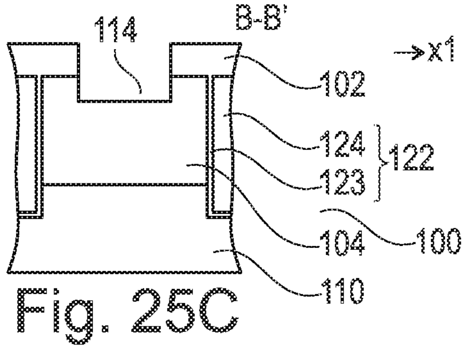

Referring to the schematic plan view of FIG. 25A and to the schematic cross-sectional views of FIGS. 25B and 25C, the exposed parts of the first contact layer 118 on the first semiconductor region 104 in the first and second parts 151, 152 are removed, e.g. by one or more etch processes, and the mask pattern 161 is removed.

Figure 26A:
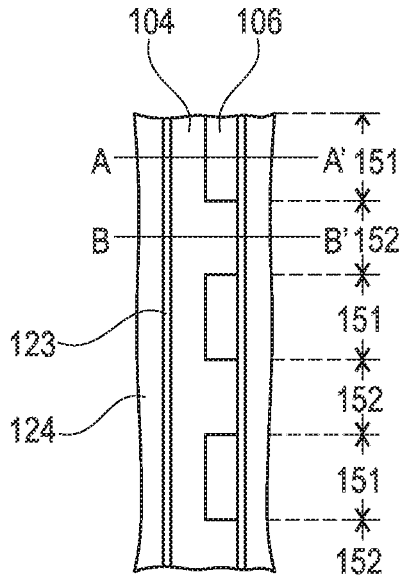
Figure 26B:
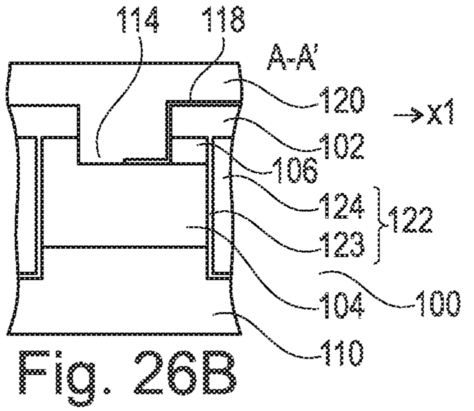
Figure 26C:
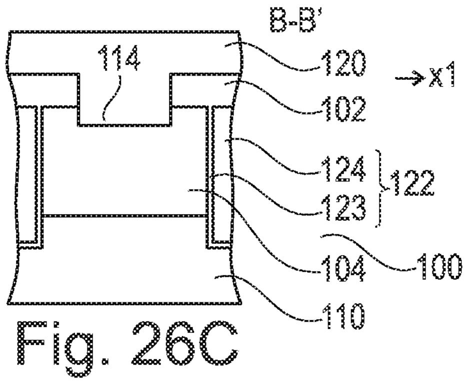
Figure 27A:
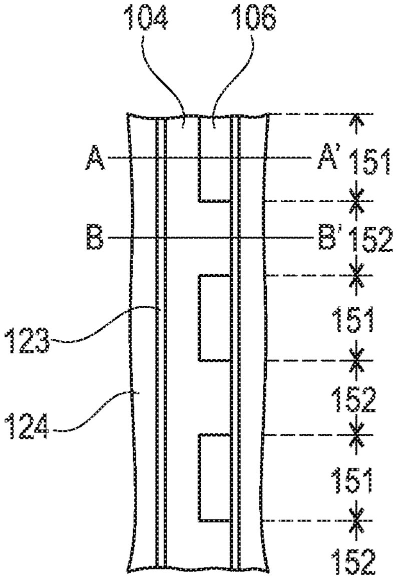
FIGS. 27A, 28A, 29A, and 30A are plan views for illustrating another embodiment of manufacturing a semiconductor device, wherein the schematic cross-section views of FIGS. 27B, 28B, 29B, and 30B are taken along the cut-line AA' of the corresponding plan view, and the schematic cross-section views of FIGS. 27C, 28C, 29C, and 30C are taken along the cut-line BB' of the corresponding plan view.
Figure 27B:
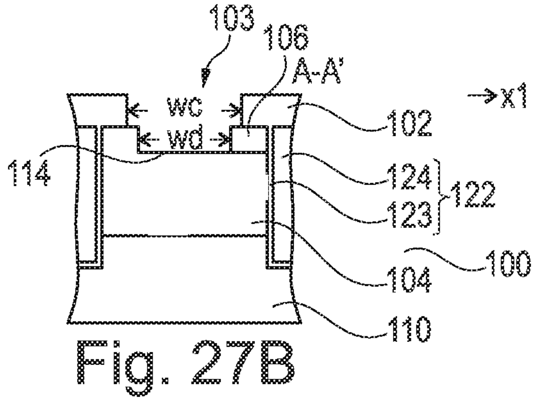
Figure 27C:
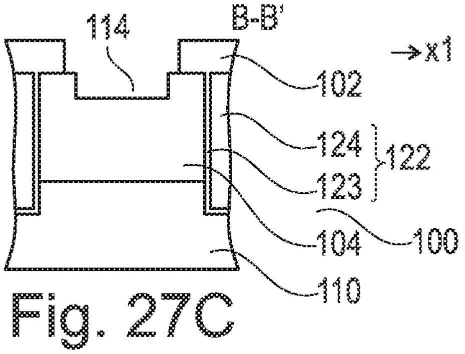
Figure 28A:
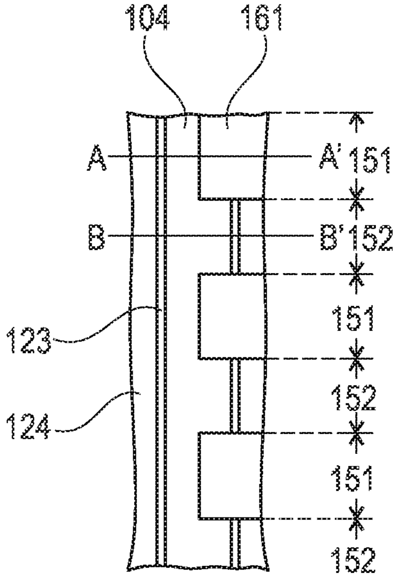
Figure 28B:
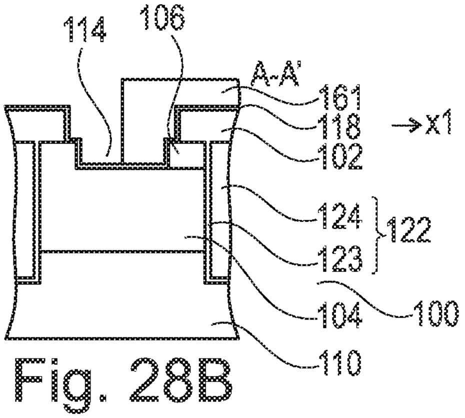
Figure 28C:
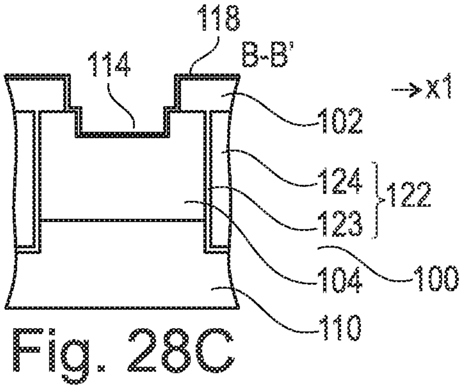
Figure 29A:
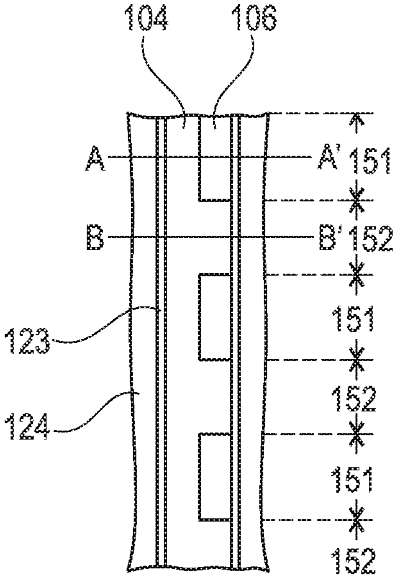
Figure 29B:
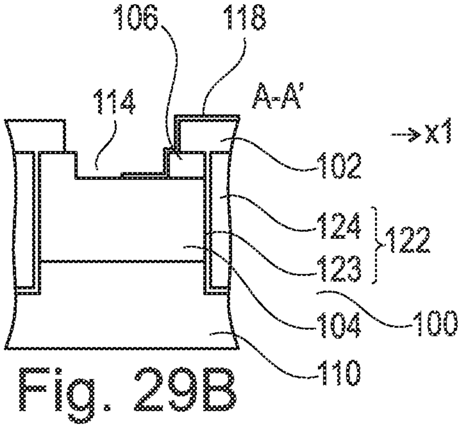
Figure 29C:
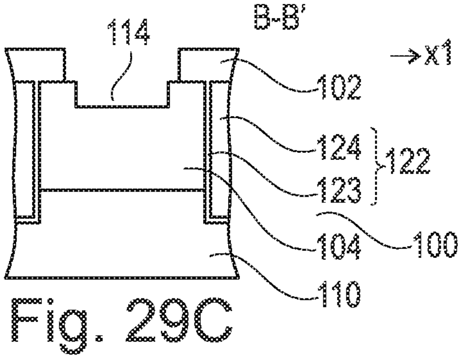
Figure 30A:
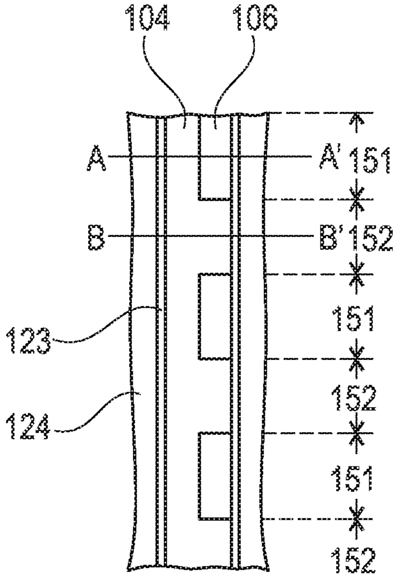
Figure 30B:
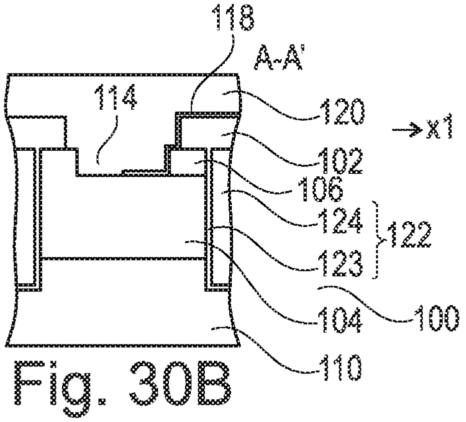
Figure 30C:
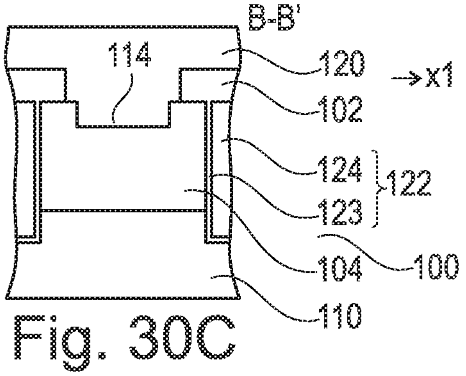

Referring to the schematic plan view of FIG. 26A and to the schematic cross-sectional views of FIGS. 26B and 26C, the second contact layer 120 is formed in direct electrical contact to the first semiconductor region 104 in the first and second parts 151, 152. The second contact layer 120 is also formed directly on the first contact layer 118.

The schematic plan views of FIGS. 27A to 30A are for illustrating another embodiment of manufacturing a semiconductor device. The schematic cross-section views of FIG. 27B to 30B are taken along the cut-line AA' of the corresponding plan view, and the schematic cross-section views of FIG. 27C to 30C are taken along the cut-line BB' of the corresponding plan view. The process features illustrated in FIGS. 27A to 30C are similar to the process features illustrated in FIGS. 23A to 26C with respect to manufacturing of the first and second contact layers 118, 120. Different from the embodiment illustrated in FIGS. 23A to 26C, in the embodiment illustrated in FIGS. 27A to 30C, the opening 103 is over-etched. This results in a larger width we of the opening 103 in the interlayer dielectric 102 compared to a width wd of the contact trench 114. Thus, a top surface portion of the second semiconductor regions 106 is exposed in addition to the side face of the second semiconductor regions 106, and the first contact layer 118 is not only formed in direct electrical contact to the side face of the second semiconductor regions 106 in the first parts 151, but also in direct electrical contact to the top surface portion of the second semiconductor regions 106.

The schematic plan views of FIGS. 31A to 34A are for illustrating another embodiment of manufacturing a semiconductor device. The schematic cross-section views of FIGS. 31B to 34B are taken along the cut-line AA' of the corresponding plan view, and the schematic cross-section views of FIGS. 31C to 34C are taken along the cut-line BB' of the corresponding plan view. In the embodiment illustrated in FIGS. 31A to 34C, the first and second contact layers 118, 120 are interchanged with respect to the embodiments of FIGS. 11A to 30C.

Figure 31A:
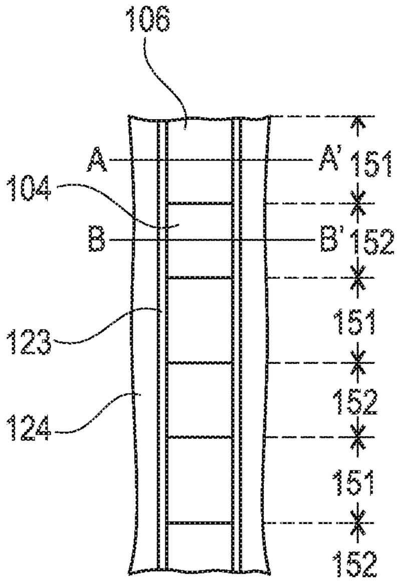
FIGS. 31A, 32A, 33A, and 34A are plan views for illustrating another embodiment of manufacturing a semiconductor device, wherein the schematic cross-section views of FIGS. 31B, 32B, 33B, and 34B are taken along the cut-line AA' of the corresponding plan view, and the schematic cross-section views of FIGS. 31C, 32C, 33C, and 34C are taken along the cut-line BB' of the corresponding plan view.
Figure 31B:
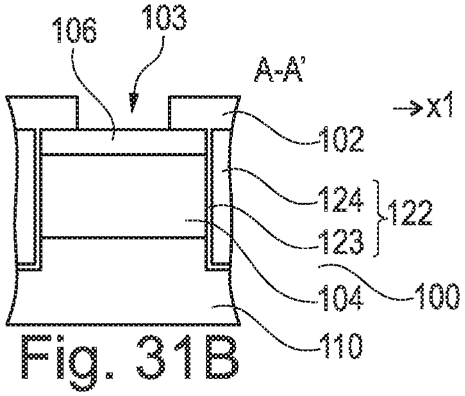
Figure 31C:
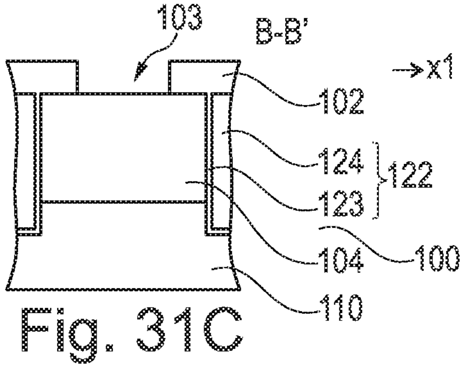

Referring to the schematic plan view of FIG. 31A and to the schematic cross-sectional views of FIGS. 31B and 31C, the semiconductor body 100 is provided, wherein the semiconductor body 100 includes the first semiconductor region 104 of the first conductivity type, e.g. a body region, and second semiconductor regions 106 of the second conductivity type, e.g. a source region. The second semiconductor regions 106 are separated from each other and interposed between the first semiconductor region 104 and the first surface 108 of the semiconductor body 100 in the first parts 151 of the first semiconductor region 104. The first parts 151 of the first semiconductor region 104 and the second parts 152 of the first semiconductor region 104 are alternately arranged along a longitudinal direction x2 of the first semiconductor region 104. The trench gate structure 122 including the trench gate dielectric 123 and the trench gate electrode 124 extends from the first surface 108 into the semiconductor body 100.

Referring to the schematic cross-sectional views of FIGS. 31B and 31C, the interlayer dielectric 102 is formed on the semiconductor body 100. The interlayer dielectric 102 may include one or a stack of dielectric materials, for example oxide(s), nitride(s), high-k dielectric(s), low-k dielectric(s). The interlayer dielectric may be formed by any suitable layer formation technique including chemical vapor deposition (CVD) and thermal oxidation. The interlayer dielectric 102 is patterned and includes the opening 103 that exposes part of the semiconductor body 100 at the first surface 108.

Figure 32A:
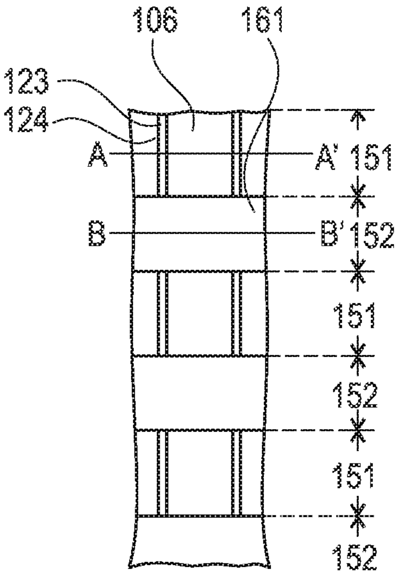
Figure 32B:
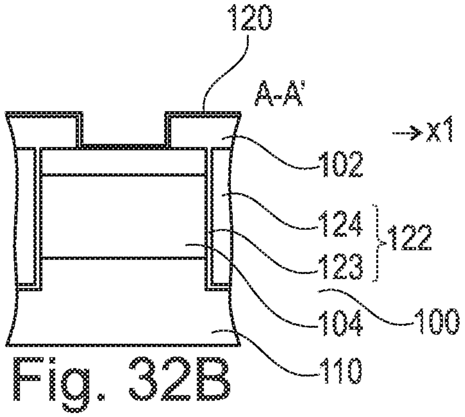
Figure 32C:
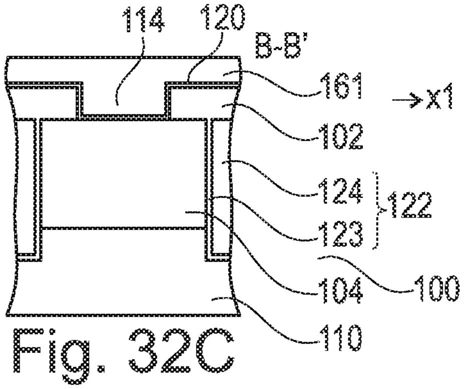

Referring to the schematic plan view of FIG. 32A and to the schematic cross-sectional views of FIGS. 32B and 32C, the second contact layer 120 is formed in direct electrical contact to the first semiconductor region 104 in the second parts 152. The second contact layer 120 is also formed on the semiconductor body 100 at the first surface 108 in the first parts 151. The mask pattern 161 is formed on the second contact layer 120, e.g. by a photolithographic process. The mask pattern 161 covers the second contact layer 120 on the first semiconductor region 104 in the second parts 152 and exposes the second contact layer 120 in the first parts 151.

Figure 33A:
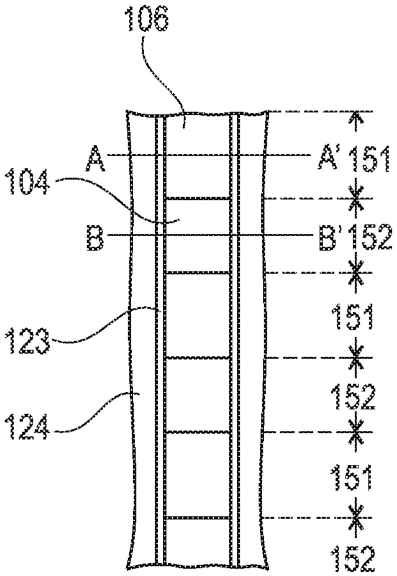
Figure 33B:
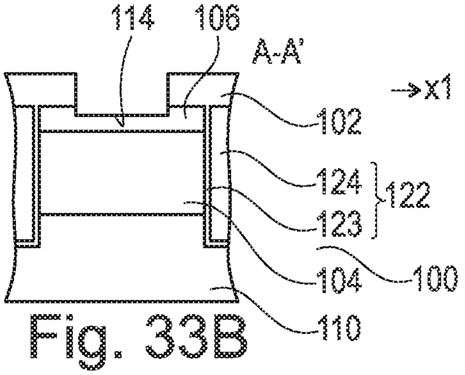
Figure 33C:
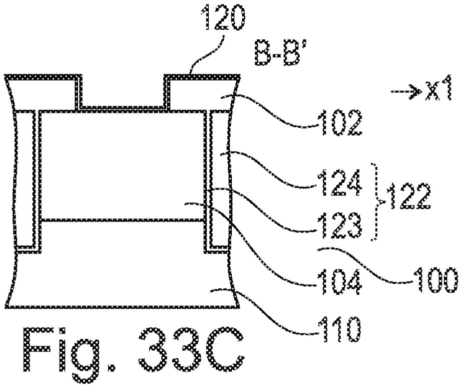

Referring to the schematic plan view of FIG. 33A and to the schematic cross-sectional views of FIGS. 33B and 33C, the exposed parts of the second contact layer 120 in first parts 151 are removed, e.g. by one or more etch processes, and the mask pattern 161 is removed. When removing the exposed parts of the second contact layer 120, an etch process may terminate on the semiconductor body 100, or may extend into the semiconductor body 100, thereby leading to the contact trench 114 as is schematically illustrated in FIGS. 33B, 33C. The contact trench 114 may also be dispensed with.

Figure 34A:
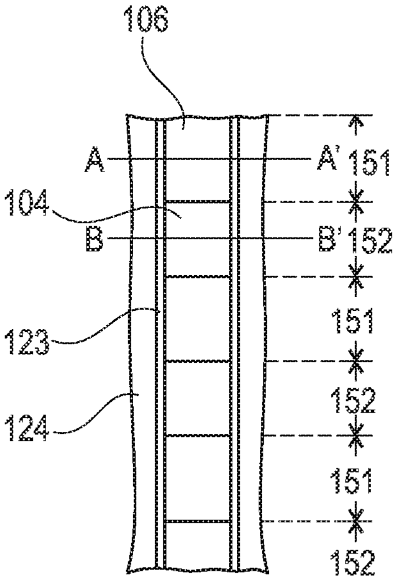
Figure 34B:
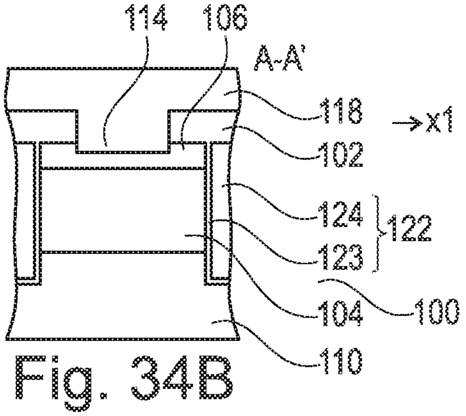
Figure 34C:
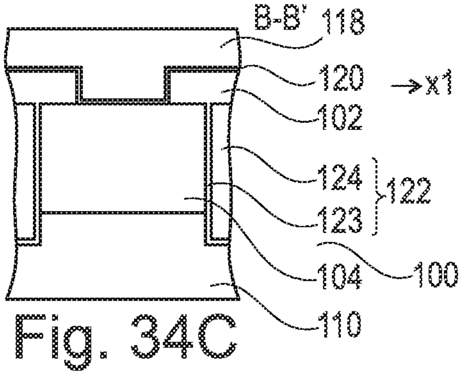
Figure 35A:
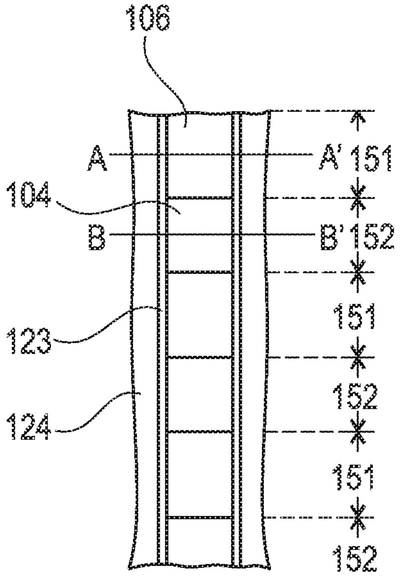
FIGS. 35A, 36A, 37A, and 38A are plan views for illustrating another embodiment of manufacturing a semiconductor device, wherein the schematic cross-section views of FIGS. 35B, 36B, 37B, and 38B are taken along the cut-line AA' of the corresponding plan view, and the schematic cross-section views of FIGS. 35C, 36C, 37C, and 38C are taken along the cut-line BB' of the corresponding plan view.
Figure 35B:
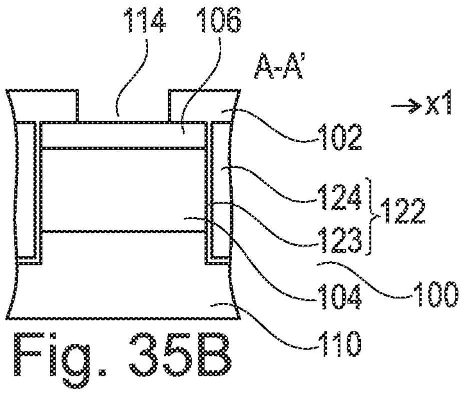
Figure 35C:
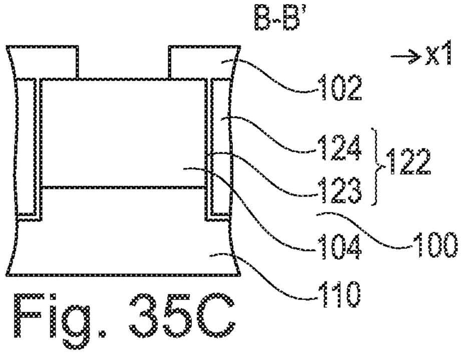
Figure 36A:
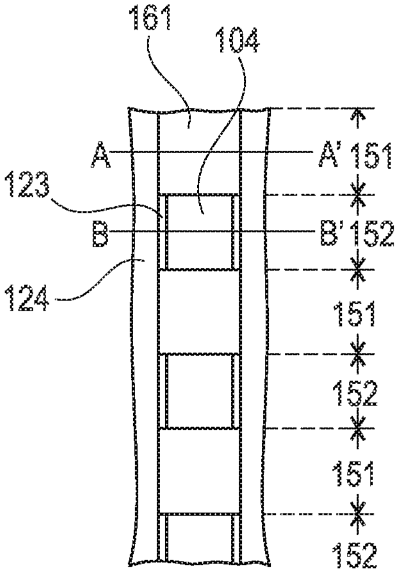
Figure 36B:
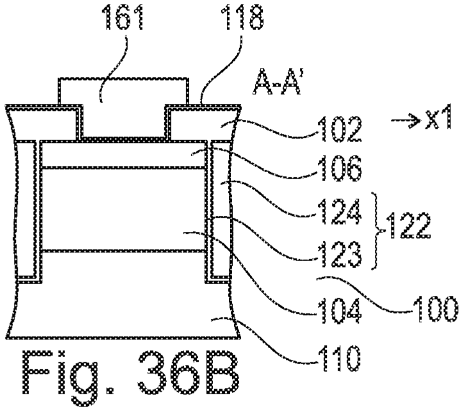
Figure 36C:
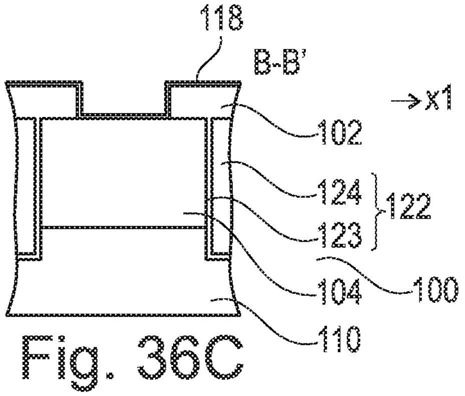
Figure 37A:
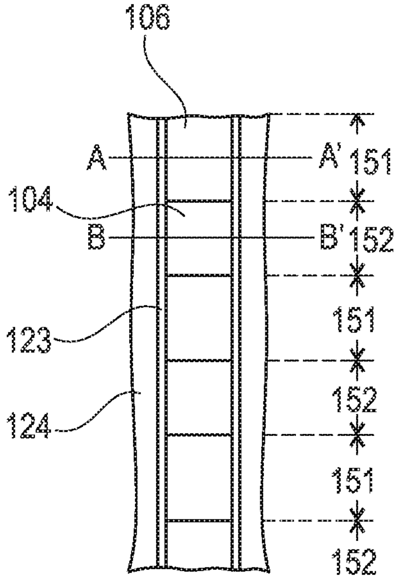
Figure 37B:
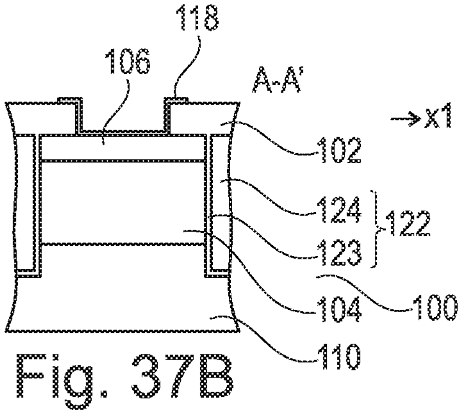
Figure 37C:
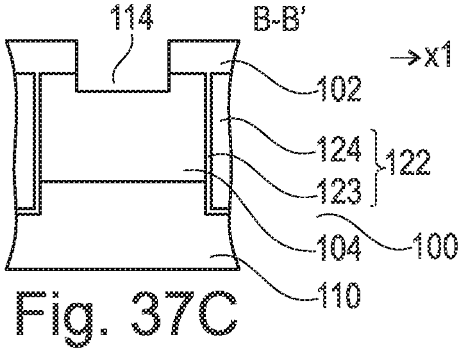
Figure 38A:
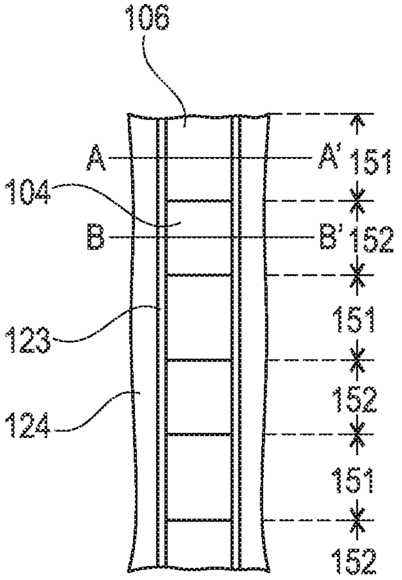
Figure 38B:
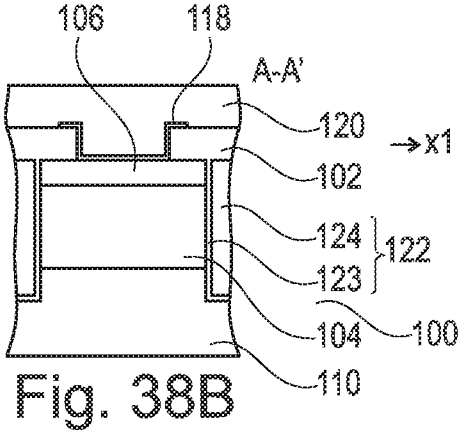
Figure 38C:
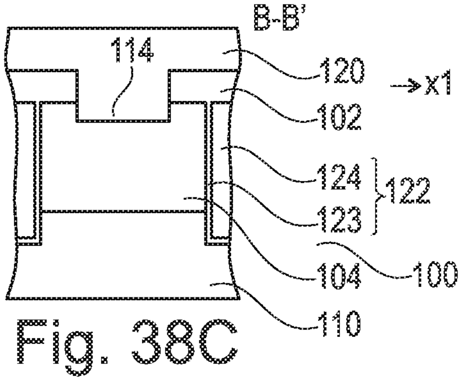
Figure 39A:
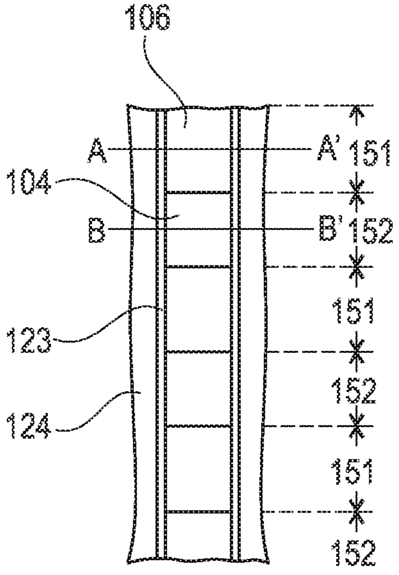
FIGS. 39A, 40A, 41A, and 42A are plan views for illustrating another embodiment of manufacturing a semiconductor device, wherein the schematic cross-section views of FIGS. 39B, 40B, 41B, and 42B are taken along the cut-line AA' of the corresponding plan view, and the schematic cross-section views of FIGS. 39C, 40C, 41C, and 42C are taken along the cut-line BB' of the corresponding plan view.
Figure 39B:
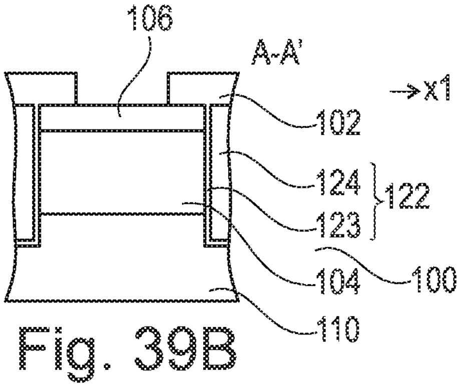
Figure 39C:
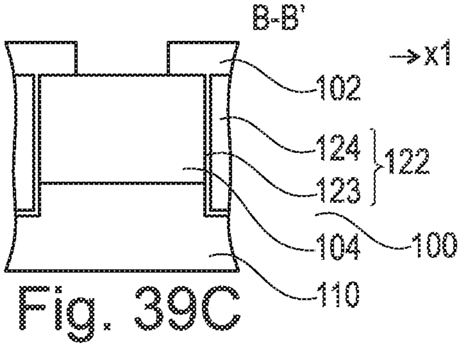
Figure 40A:
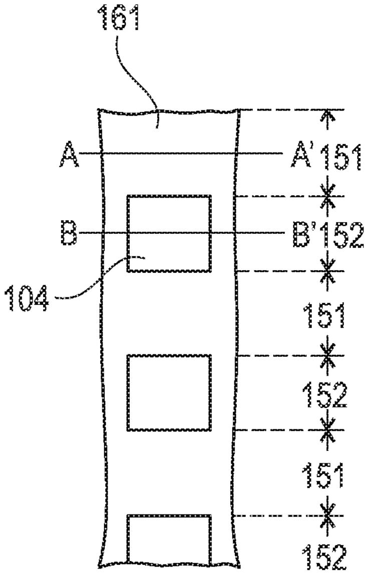
Figure 40B:
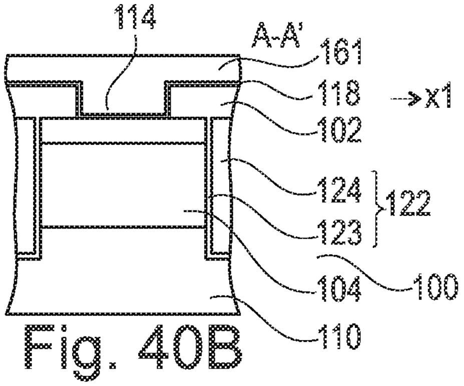
Figure 40C:
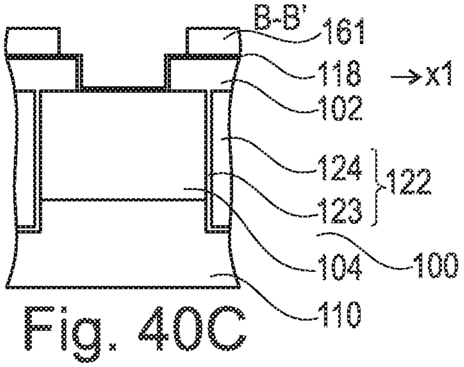
Figure 41A:
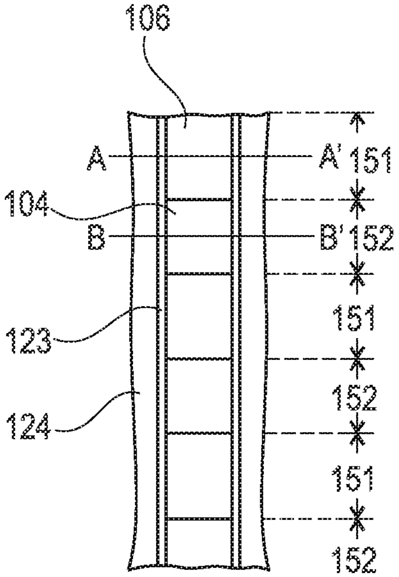
Figure 41B:
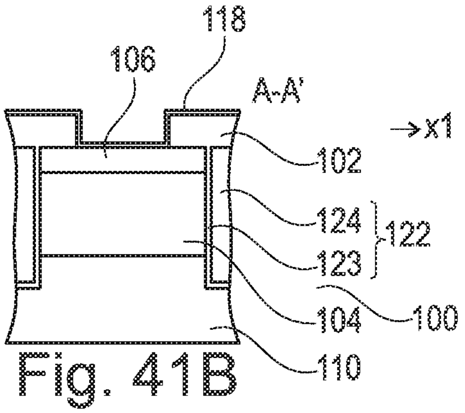
Figure 41C:
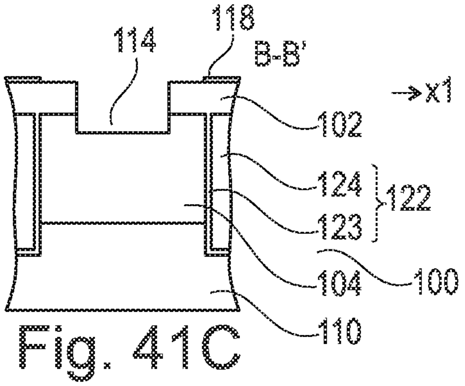
Figure 42A:
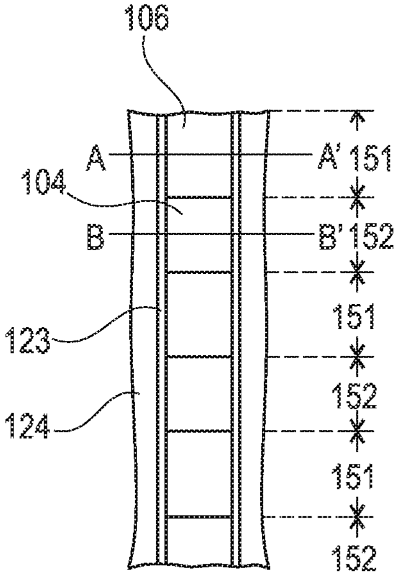
Figure 42B:
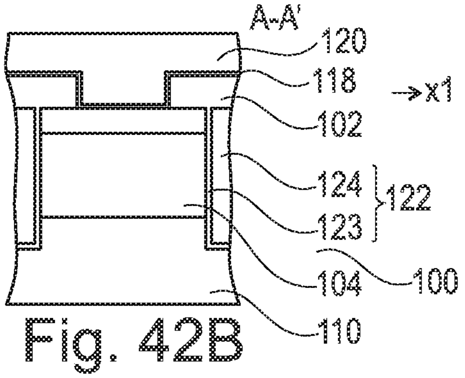
Figure 42C:
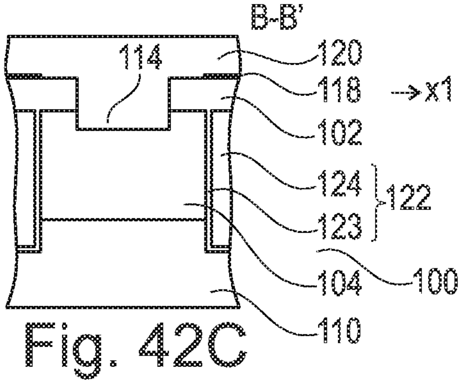

Referring to the schematic plan view of FIG. 34A and to the schematic cross-sectional views of FIGS. 34B and 34C, the first contact layer 118 is formed in direct electrical contact to the second semiconductor regions 106 in the first parts 151. The first contact layer 118 is also formed directly on the second contact layer 120.

The schematic plan views of FIGS. 35A to 38A are for illustrating another embodiment of manufacturing a semiconductor device. The schematic cross-section views of FIGS. 35B to 38B are taken along the cut-line AA' of the corresponding plan view, and the schematic cross-section views of FIG. 35C to 38C are taken along the cut-line BB' of the corresponding plan view. The process features illustrated in FIGS. 35A to 38C are similar to the process features illustrated in FIGS. 15A to 18C with respect to manufacturing of the first and second contact layers 118, 120. Different from the embodiment illustrated in FIG. 15A to 18C, the mask pattern 161 in FIG. 36A merely covers a part of the first contact layer 118 in the first parts 151. Thus, exposed parts of the first contact layer 118 in the first parts 151 are removed from the interlayer dielectric 102 in the first parts 151, thereby minimizing a contact area between the first contact layer 118 and the interlayer dielectric 102.

The schematic plan views of FIGS. 39A to 42A are for illustrating another embodiment of manufacturing a semiconductor device. The schematic cross-section views of FIGS. 39B to 42B are taken along the cut-line AA' of the corresponding plan view, and the schematic cross-section views of FIGS. 39C to 42C are taken along the cut-line BB' of the corresponding plan view. The process features illustrated in FIGS. 39A to 42C are similar to the process features illustrated in FIGS. 15A to 18C with respect to manufacturing of the first and second contact layers 118, 120. Different from the embodiment illustrated in FIGS. 15A to 18C, the mask pattern 161 in FIG. 36A not only covers the first contact layer 118 in the first parts 151, but also covers part of the first contact layer 118 in the second parts 152. Thus, as is illustrated in the cross-sectional views of FIGS. 41B, 41C, also part of the first contact layer 118 will remain in the second parts 152 after the etch process, thereby maximizing a contact area between the first contact layer 118 and the interlayer dielectric 102.

The manufacturing methods illustrated in FIGS. 11A to 42C are examples for manufacturing a semiconductor device including the semiconductor body 100 comprising the first semiconductor region 104 of the first conductivity type and the second semiconductor regions 106 of the second conductivity type, wherein the second semiconductor regions 106 are separated from each other and interposed between the first semiconductor region 104 and the first surface 108 of the semiconductor body 100 in the first parts 151 of the first semiconductor region 104, wherein the first parts 151 of the first semiconductor region 104 and the second parts 152 of the first semiconductor region 104 are alternately arranged along the longitudinal direction x2 of the first semiconductor region 104. The first contact layer 118 is in direct electrical contact to the second semiconductor regions 106 in the first parts 151, and the second contact layer 120 is in direct electrical contact to the first semiconductor region 104 in the second parts 152.

The first semiconductor region 104 may be a body region of an insulated gate field effect transistor, IGFET, or an insulated gate bipolar transistor, IGBT, or a MOS controlled thyristor, MCT, and the second semiconductor regions 106 may be source regions of the insulated gate field effect transistor, IGFET, or the insulated gate bipolar transistor, IGBT, or the MOS controlled thyristor, MCT.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method for manufacturing a semiconductor device, the method comprising:

providing a semiconductor body comprising a first semiconductor region of a first conductivity type and second semiconductor regions of a second conductivity type, the second semiconductor regions being separated from each other and interposed between the first semiconductor region and a first surface of the semiconductor body in first parts of the first semiconductor region, the first parts of the first semiconductor region and second parts of the first semiconductor region being alternately arranged along a longitudinal direction of the first semiconductor region;

forming a first contact layer in direct electrical contact to the second semiconductor regions in the first parts; and forming a second contact layer in direct electrical contact to the first semiconductor region in the second parts.

2. The method of claim 1, wherein the first semiconductor region is a body region of an insulated gate field effect transistor (IGFET), or an insulated gate bipolar transistor (IGBT), or a MOS controlled thyristor (MCT), and wherein the second semiconductor regions are source regions of the IGFET or the IGBT, or the MCT.

3. The method of claim 1, wherein a first dimension of the first semiconductor region along a lateral direction perpendicular to the longitudinal direction is larger than a second dimension of the second semiconductor regions along the lateral direction.

4. The method of claim 1, wherein forming the first contact layer is carried out before forming the second contact layer, and wherein the first contact layer is at least partly removed in the second parts.

5. The method of claim 4, further comprising partly removing the first contact layer in the first parts.

6. The method of claim 1, wherein forming the second contact layer is carried out before forming the first contact layer, and wherein the second contact layer is at least partly removed in the first parts.

7. The method of claim 1, further comprising forming a contact trench in at least one of the first and second parts, and wherein at least one of the first and second contact layers is formed in the contact trench.

8. The method of claim 1, wherein the second contact layer is partly formed in direct contact with the first contact layer.

9. The method of claim 1, wherein the first conductivity type is p-type, the first contact layer comprises a first contact material, the first contact material is one or a combination of Ti, W, TiW, Ta, V, Ag, Zr, TiSi, CoSi, the second contact layer comprises a second contact material, and the second contact material is one or a combination of Al, AlSi, AlSiCu, Pt, PtSi, Pd, Ni, Co, Rh; or wherein the first conductivity type is n-type, the first contact layer comprises a first contact material, the first contact material is one or a combination of Al, AlSi, AlSiCu, Pt, PtSi, Pd, Ni, Co, Rh, the second contact layer comprises a second contact material, and the second contact material is one or a combination of Ti, W, TiW, Ta, V, Ag, Zr, TiSi, CoSi.

10. A semiconductor device, comprising:

a semiconductor body comprising a first semiconductor region of a first conductivity type and second semiconductor regions of a second conductivity type, the second semiconductor regions being separated from each other and interposed between the first semiconductor region and a first surface of the semiconductor body in first parts of the first semiconductor region, the first parts of the first semiconductor region and second parts of the first semiconductor region being alternately arranged along a longitudinal direction of the first semiconductor region;

a first contact layer in direct electrical contact to the second semiconductor regions in the first parts; and a second contact layer in direct electrical contact to the first semiconductor region in the second parts.

11. The semiconductor device of claim 10, wherein the first semiconductor region is a body region of an insulated gate field effect transistor (IGFET), or an insulated gate bipolar transistor (IGBT), or a MOS controlled thyristor (MCT), and wherein the second semiconductor regions are source regions of the IGFET, or the IGBT, or the MCT.

12. The semiconductor device of claim 10, wherein a first dimension of the first semiconductor region along a lateral direction perpendicular to the longitudinal direction is larger than a second dimension of the second semiconductor regions along the lateral direction.

13. The semiconductor device of claim 10, further comprising a contact trench in at least one of the first and second parts, and wherein at least one of the first and second contact layers is arranged in the contact trench.

14. The semiconductor device of claim 10, wherein the second contact layer is partly formed in direct contact with the first contact layer.

15. The semiconductor device of claim 10, wherein the first conductivity type is p-type, the first contact layer comprises a first contact material, the first contact material is one or a combination of Ti, W, TiW, Ta, V, Ag, Zr, TiSi, CoSi, the second contact layer comprises a second contact material, and the second contact material is one or a combination of Al, AlSi, AlSiCu, Pt, PtSi, Pd, Ni, Co, Rh; or wherein the first conductivity type is n-type, the first contact layer comprises a first contact material, the first contact material is one or a combination of Al, AlSi, AlSiCu, Pt, PtSi, Pd, Ni, Co, Rh, the second contact layer comprises a second contact material, and the second contact material is one or a combination of Ti, W, TiW, Ta, V, Ag, Zr, TiSi, CoSi.

* * * * *